United States Patent
Mostafanezhad et al.

(10) Patent No.: US 10,715,166 B2
(45) Date of Patent: Jul. 14, 2020

(54) SYSTEM AND METHOD FOR HIGH-SAMPLE RATE TRANSIENT DATA ACQUISITION WITH PRE-CONVERSION ACTIVITY DETECTION

(71) Applicant: Nalu Scientific, LLC, Honolulu, HI (US)

(72) Inventors: Isar Mostafanezhad, Honolulu, HI (US); Luca Macchiarulo, Honolulu, HI (US); Dean Uehara, Honolulu, HI (US); Christopher Chock, Honolulu, HI (US); Benjamin Rotter, Honolulu, HI (US)

(73) Assignee: NALU Scientific, LLC, Honolulu, HI (US)

( * ) Notice: Subject to any disclaimer, the term of this patent is extended or adjusted under 35 U.S.C. 154(b) by 0 days.

(21) Appl. No.: 16/568,126

(22) Filed: Sep. 11, 2019

(65) Prior Publication Data

US 2020/0083896 A1    Mar. 12, 2020

Related U.S. Application Data

(60) Provisional application No. 62/758,714, filed on Nov. 12, 2018, provisional application No. 62/758,711, filed on Nov. 12, 2018, provisional application No. 62/731,517, filed on Sep. 14, 2018, provisional application No. 62/729,823, filed on Sep. 11, 2018.

(51) Int. Cl.
*H03M 1/12* (2006.01)
*G01S 17/02* (2020.01)
*G01N 23/225* (2018.01)

(52) U.S. Cl.
CPC ........ *H03M 1/1245* (2013.01); *G01N 23/225* (2013.01); *G01S 17/02* (2013.01)

(58) Field of Classification Search
CPC .......................... H03M 1/1245; G01N 23/225
USPC .................................................. 341/118–155
See application file for complete search history.

(56) References Cited

U.S. PATENT DOCUMENTS

| 5,467,377 | A | * | 11/1995 | Dawson | ................ | A61B 6/032 378/19 |
| 6,031,479 | A | * | 2/2000 | Slizynski | ............ | H03M 1/1245 341/155 |
| 6,808,307 | B1 | * | 10/2004 | Aslan | ..................... | G01K 1/028 374/178 |
| 7,394,415 | B2 | * | 7/2008 | Fuse | ................... | H03M 1/1038 341/120 |
| 2004/0066868 | A1 | * | 4/2004 | Gavardoni | .......... | H03M 1/1245 375/354 |

(Continued)

*Primary Examiner* — Lam T Mai
(74) *Attorney, Agent, or Firm* — Staniford Tomita LLP

(57) ABSTRACT

Diverse applications in particle physics experiments and emerging technologies such as Lidar are driving performance increase and cost reduction in giga-hertz sampling-rate high-resolution data conversion. In applications such as these, critical aspects of the data may occur only during relatively short nanosecond portions of observation periods lasting microseconds. Data acquisition architectures that key in on regions of the data containing activity, digitize the data, and provide info to accurately measure the position of the data in time relative to a time reference are described. These architectures may facilitate system implementation and reduce overall system cost.

20 Claims, 28 Drawing Sheets

(56) References Cited

U.S. PATENT DOCUMENTS

| | | | |
|---|---|---|---|
| 2010/0078565 A1* | 4/2010 | Tsubota | G01T 1/00 250/358.1 |
| 2010/0226330 A1* | 9/2010 | Haque | H03M 1/1215 370/329 |
| 2011/0080925 A1* | 4/2011 | Molina | H03M 1/0872 370/538 |
| 2012/0310601 A1* | 12/2012 | Martin | H03H 17/0223 702/190 |
| 2015/0015428 A1* | 1/2015 | Snelgrove | H03M 1/12 341/155 |
| 2015/0370234 A1* | 12/2015 | Lehane | G01R 13/0272 326/46 |
| 2017/0108541 A1* | 4/2017 | Oda | G01R 19/16547 |
| 2017/0258415 A1* | 9/2017 | Onouchi | H03M 1/0624 |

* cited by examiner

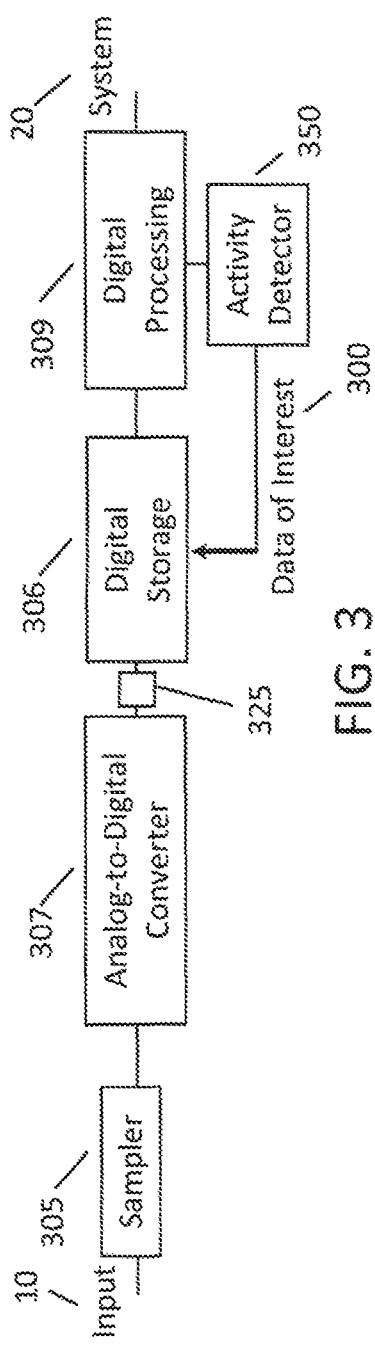
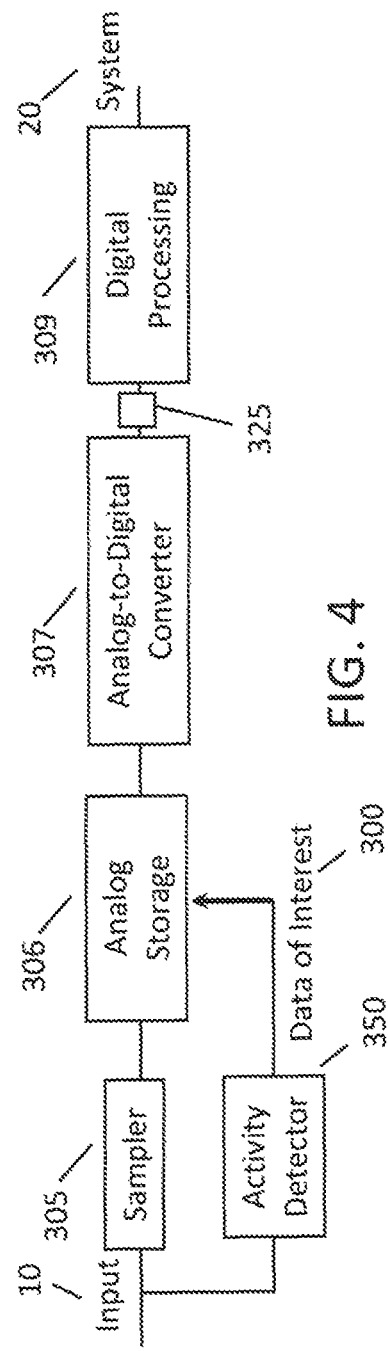

SYSTEM AND METHOD FOR HIGH-SAMPLE RATE TRANSIENT DATA ACQUISITION WITH PRE-CONVERSION ACTIVITY DETECTION

CROSS-REFERENCE TO RELATED APPLICATIONS

This application claims priority to U.S. Provisional Patent Application No. 62/758,714, "Data Acquisition SoC for Waveform Sampling and Feature Extraction with Picosecond Timing" filed on Nov. 12, 2018, U.S. Provisional Patent Application No. 62/758,711, "Data Acquisition SoC for Waveform Sampling and Feature Extraction with Picosecond Timing" filed on Nov. 12, 2018, U.S. Provisional Patent Application No. 62/731,517, "Design and Calibration of SystemOonChip Switched Capacitor Array Based Waveform Digitizers For Particle Tracking" filed on Sep. 14, 2018, and U.S. Provisional Patent Application No. 62/729,823, "System On-Chip For Fast Timing Measurements" filed on Sep. 11, 2018. U.S. Provisional Patent Application Nos. 62/758,714, 62/758,711, 62/731,517, and 62/729,823 are hereby incorporated by reference in their entirety.

FIELD OF THE INVENTION

Embodiments disclosed relate to systems and methods for gigahertz sampling analog-to-digital converters for applications in particle physics experiments and emerging technologies such as Lidar where critical aspects of the data being observed occur only during relatively short nanosecond portions of observation periods lasting microseconds. Optimizing the architecture of the data acquisition circuitry to key in only on regions of the data that may be of interest may result in significant reduction in overall system implementation complexity, power management requirements, and may ease implementation complexity and reduce overall system cost.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be embodiments of the invention.

Scientists may gain insights into fundamental principles and understanding of materials through particle accelerator experiments. In these experiments, the velocity of a first group of particles may be increased in a magnetic field and made to collide with an object or second group of particles accelerated and directed to collide with the first group. Sensors may be used to observe collision artifacts resulting from the collisions. Collision artifacts may typically be present for very short periods of time. The duration of collision artifacts may define an observation period of interest. In some applications, collision artifacts may be available for a few nanoseconds. In some experiments, one or a small set of sensors may be used to detect collision artifacts. In other experiments, a large number of sensors may be used to simultaneously observe collision artifacts. The number of sensors that may be used in experiments may number in the tens, hundreds, thousands, or even hundreds of thousands. In many applications, accurate timing measurements of collisions and collision artifacts are critical measured parameters. In some applications, the desired relative timing accuracy, that is the desired relative timing between collisions and collision artifacts may be under 100 picoseconds. In some applications, the desired relative timing accuracy may be under 20 picoseconds. In some applications, the desired relative timing accuracy may be under one picosecond. In future applications, the desired relative timing accuracy may be on the order of femtoseconds. In future applications, the desired relative timing accuracy may be less than one femtosecond. In order to accurately capture the signals received from the sensors, very high sampling rates are used in the data acquisition electronics. In some applications, the sampling rate may be hundreds of megahertz. In some applications, the sampling rate may be gigahertz. For example, in an application, the sampling rate may be one-gigahertz. In another application, the sampling rate may be ten-gigahertz. In another application, the sampling rate may exceed ten-gigahertz.

There may be other existing and emerging applications where the time arrival of events may be detected by sensors and accurately translated into the digital domain by data acquisition electronics. An example of such as system is Lidar. Lidar is an acronym which stands for Light Detection and Ranging. In a Lidar system, a Lidar device may include a light source, a light detector, and measurement electronics. In an application, the light source may be a laser. One or more pulses of light may be emitted by the laser. Light emitted from the laser may be directed in a specific direction. When the pulse of emitted laser light hits a remote object, it may reflect off the object and a portion of the emitted laser light may return to the Lidar device as reflected laser light. The reflected laser light may be received by the light detector and processed by the support electronics. The roundtrip time duration from the instant the light is transmitted from the light source as transmitted light, to the instant the reflected light is received by the light detector may be measured by the measurement electronics. Based on the roundtrip time duration, the system may calculate the distance from the Lidar device to the remote object. The maximum roundtrip time duration may be limited by the distance limit between the Lidar device and the remote device. If the distance between the Lidar device and a remote object exceeds a distance limit, the object may not be identified. For some applications, the maximum roundtrip time duration may be on the order of microseconds. In an application, the maximum roundtrip time duration may be six microseconds. In an application, the maximum roundtrip time duration may be less than six microseconds. In another application, the maximum roundtrip time duration may be greater than six microseconds. In the application of Lidar, the relative timing accuracy may translate into a distance measurement accuracy between the Lidar device and the remote object. A relative timing accuracy of 1 nanosecond may translate to a distance measurement accuracy of approximately 0.3 meters.

Some implementations of Lidar utilize time-to-digital converters which may have a simple implementation utilizing a comparator and a counter. Other implementations may utilize an analog-to-digital converter and matched filtering which may be less sensitive to noise and the well-known problem of range walk error. However, due to the large amount of data that needs to be handled using analog-to-digital conversion, system designers often choose systems utilizing time-to-digital converters for simplicity. If the use of analog-to-digital converter-based designs can be made convenient, their use may become more prevalent due to the potential advantages in system robustness and accuracy.

To summarize, there are existing and emerging applications where data acquisition electronics with sample rates in the hundreds of megahertz to the gigahertz range, time events with a signal duration of interest as low as a few nanoseconds for collider experiments, observation periods up through microseconds for applications such as Lidar, and timing accuracy in the range of tens of picoseconds or less. Analog-to-digital converter resolutions may be between the range of six-bits to ten bits. In some applications, analog-to-digital converter resolutions fewer than six bits may be used. In other applications, analog-to-digital converter resolutions greater than ten bits may be used. The data acquisition system may provide: a. Digitized data—active portions of the signal may be converted to digital representation with moderate resolution and high sample rate; and b. Timing data—data to enable the identification of the position of a signal occurrence in time relative to a timing reference.

Architecting the data acquisition architecture to key in on portions of data that may contain data of interest and ignore data that may not contain data of interest may result in significant reduction in implementation complexity, peak current, power management, and power distribution requirements. The results may facilitate ease of use and reduce overall system cost.

SUMMARY OF THE INVENTION

A data acquisition system may periodically sample a continuous input signal and convert the samples to the digital domain using an analog-to-digital converter. In systems requiring sampling frequencies in the gigahertz range, and analog-to-digital converter resolutions with 8 or more bits, a large amount of digital data may be generated in a short time. Analog-to-digital converters with sampling frequency in the gigahertz range and high-speed storage pose implementation challenges. Such challenges can be exacerbated in systems such as particle accelerator collision systems where a multiplicity of sensors and data acquisition systems may be used in parallel. In these particle accelerator collision systems, the input signal is predominantly zero-valued or unchanging in value, and non-zero or changing in value only for relatively short periods of time. To implement such systems, the challenges of high-rate analog-to-digital conversion and storage must first be met. Then, digital data must be searched through to identify non-zero data and the location of the non-zero data in time relative to a time reference. In the present invention, an array of sampling circuits, analog storage cells, and an activity detector may be utilized. Instead of converting input samples to the digital domain at gigahertz rate, sampling circuits sample a portion of the input signal at the gigahertz rate and these samples may be temporarily stored by the sampling circuits. An activity detector may identify if samples in temporary storage are non-zero or otherwise indicate activity in the input signal. Such samples may be the to contain data of interest. If the samples temporarily stored by the sampling circuits are found to contain data of interest, the samples may be passed to analog storage. From analog storage, the samples identified to contain data of interest may be converted to the digital domain by an analog-to-digital converter. The invention may reduce the required conversion rate of the analog-to-digital converter. The invention may allow the analog-to-digital converter to be implemented by a number of parallel analog-to-digital converters. The invention may reduce the amount of digital storage required by identifying regions of the input signal with activity before conversion to the digital domain. The activity detector may identify samples of the incoming data wherein the receive signal has changing values for one or more samples. A number of embodiments, capabilities, and features of the activity detector are summarized.

In an embodiment, time-interleaved sampling arrays may be used wherein a sampling array may contain a multiplicity of sampling circuits that in a first phase successively sample the input signal at the sampling frequency, temporarily hold the samples, and during a second phase may transfer the samples to analog storage cells. While a first sampling array is in the sample and hold phase, a second sampling array may be in the transfer phase.

In an embodiment, a number of contiguous samples may be taken and treated as a group. Such a group of samples may be referred to as a Time Window. In an embodiment, a time window may contain a fixed number of samples and time windows may be uniform in duration. In an embodiment, a time window may be 6 nanoseconds in duration. In another embodiment, a time window may be shorter than 6 nanoseconds. In another embodiment, a time window may be longer than 6 nanoseconds. In an embodiment, the sample and hold phase of time-interleaved sampling arrays may be equal in duration to the time window wherein the product of the number of sampling circuits and the sampling period may be equal to a time window.

In an embodiment, a multiplicity of contiguous Time Windows may comprise an Observation Period. In an embodiment, the Observation Period may be 2.4 microseconds in duration. In another embodiment, the Observation Period may be less than 2.4 micro-seconds. In another embodiment, the Observation Period may be greater than 2.4 micro-seconds.

In an embodiment, an activity detector may be used to identify Data of Interest. In an embodiment wherein a portion of the input signal is sampled onto sampling circuits and temporarily stored on the sampling circuits during a time window, the activity detector may receive one or more samples during the same time window to evaluate if the sampled values may contain Data of Interest.

In an embodiment, a time window may be identified to contain Data of Interest if changes in the sampled values are identified. In an embodiment, a time-window may be identified to contain Data of Interest of sampled values are non-zero or changing with time. In an embodiment, a time-window may be identified to contain Data of Interest if a target pulse shape may be identified. In an embodiment, a time window may be identified to contain Data of Interest if a portion of a target pulse shape may be identified. In an embodiment, a time window may be identified to contain Data of Interest if one or more sampled values exceeds a threshold. In an embodiment, another measure may be used to identify of sampled data corresponding to a time window may contain Data of Interest.

In an embodiment, operation of the activity detector may be time synchronized with the phases of the time-interleaved sampling arrays.

In an embodiment, an activity detector may be comprised of a simple quantizer, memory, and a Dynamic Window Selector (DWS). The output of the simple quantizer may be input to the memory. The output of the memory may be input to the DWS.

In an embodiment, the sample rate of the Simple Quantizer may be greater than 20 MHz and up to or equal to the sample rate of the main analog-to-digital converter. In an embodiment, the sample rate of the Simple Quantizer may be greater than 20 MHz and up to or equal to the sample rate of the main analog-to-digital converter. In an embodiment, the sample rate of the Simple Quantizer may be lower than the sample rate of the main analog-to-digital converter. In an embodiment, the resolution of the Simple Quantizer which can be between 1-6 bits which may be less than the resolution of the main analog-to-digital converter. In an embodiment, the Simple Quantizer may be implemented with a comparator. In an embodiment implementing the Simple Quantizer with a comparator, the threshold may be fixed. In an embodiment implementing the Simple Quantizer with a comparator, the threshold may be variable and be made to track the value of a parameter in the system. In an embodiment, the threshold may be made greater than a DC value associated with the sensor output when the sensor output is unchanging so that when the DC sensor output can exceed the DC threshold value when activity is detected.

In an embodiment, the Simple Quantizer may utilize parallelism. A circuit implementation utilizing parallelism may involve a multiplicity of similar circuit elements operating on the same input and operating in a time-staggered manner. N circuit elements may each be controlled by a clock with period T and each operated staggered in time with delay T/N. The effective sampling period may be T/N while each element may be allowed T seconds to operate. Parallelism may result in an effectively higher sample rate than otherwise achievable using a single element.

In an embodiment, the Simple Quantizer may utilize pipelining. Pipelining may be utilized in a circuit implementation when the function being implemented may be separated into two or more steps and may utilize two phases of a clock cycle. In the first phase of the first clock cycle, the first portion of the function may be implemented by a first circuit. In the second phase of the first clock cycle, the first circuit may transfer its result to a second circuit wherein the second circuit may perform a second portion of the function. In the first phase of the second clock cycle, the first circuit may operate on a new input while the second circuit may transfer its result to a third circuit wherein the third circuit may perform a third portion of the function. Each of the first circuit, second circuit, and third circuit may be identified as a pipeline stage. A sufficient number of pipeline stages may be utilized to implement the function. Each circuit may perform a first step of operating on its input in the first clock phase and perform a second step of transferring its result to the following circuit during the second clock phase. By separating a function into two or more steps, a higher throughput may be attained than otherwise achievable utilizing a single element operating on two phases of a clock.

In an embodiment, the DWS may use samples from the Simple Quantizer to identify a Time Window which may contain Data of Interest. In an embodiment, a Time Window identified to contain Data of Interest may be passed to the main analog-to-digital converter for conversion to the digital domain. In an embodiment, additional Time Windows preceding or following the time window or windows identified to contain Data of Interest may also be passed to the main analog-to-digital converter for conversion to the digital domain.

In an embodiment, a reference point in time may be established. In an embodiment, the reference point in time may be determined by a Begin Conversion signal. In an embodiment, the begin conversion signal may be provided by the system.

In an embodiment, each time window may be assigned a time-stamp identifier to enable the relative time of a time window to begin conversion signal to be identified. In an embodiment, the time-stamp identifier may be associated to a time window via a look-up table.

In an embodiment, the DWS may be controlled via external control.

In an embodiment, DC-offset correction and systematic sampling asymmetry, may be performed only on the samples identified to be within Time Windows identified to contain Data of Interest.

In an embodiment, the DWS may be implemented using fixed-logic. In an embodiment, the DWS may be implemented using a microcontroller. In an embodiment, control of the DWS may be time-varying due to time-varying system needs.

In an embodiment, the DWS may reduce the data required to be stored and passed to the system digital back-end by identifying before data conversion Time Windows containing Data of Interest.

In an embodiment, the main analog-to-digital converter may utilize a single-ramp analog-to-digital converter architecture. In another embodiment, a different analog-to-digital converter architecture may be used. In an embodiment, the main analog-to-digital converter may be implemented with a multiplicity of parallel analog-to-digital converters.

In an embodiment, the high-speed sampling circuits, the Time Window analog hold blocks, the main analog-to-digital converter, clock and timing generators, and the DWS may be implemented on the same substrate. In an embodiment, the high-speed sampling circuits, the Time Window analog hold blocks, the main analog-to-digital converter, clock and timing generators, and the DWS may be implemented within the same module. In an embodiment, the high-speed sampling circuits, the Time Window analog hold blocks, the main analog-to-digital converter, clock and timing generators, and the DWS for multiple channels may be implemented on the same substrate. In an embodiment, the high-speed sampling circuits, the Time Window analog hold blocks, the main analog-to-digital converter, clock and timing generators, and the DWS for multiple channels may be implemented within the same module.

A standalone data acquisition channel may be comprised of high-speed sampling circuits, the Time Window analog hold blocks, the main analog-to-digital converter, clock and timing generators, and a DWS with associated Simple Quantizer block. All of the Time Window blocks may be utilized to continuously cover a maximum Observation Period for the data acquisition channel. Multiple data acquisition channels may be coordinated in time by the system. In an embodiment, multiple data acquisition channels may be operated in parallel to simultaneously observe the outputs of multiple sensors. In another embodiment, multiple data acquisition channels may be operated sequentially achieve an effective Observation Period longer than the Observation Period for any one channel. In an embodiment in which four data acquisition channels are used, by operating a first channels for a first observation period, followed by the operation of a second channel for a second observation period, and continuing until all four channels are used, an effective observation period equal to four times the observation period of a single channel may be implemented.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

FIG. 3 illustrates a conventional block diagram of the data acquisition function.

FIG. 4 illustrates a block diagram of the data acquisition function utilizing analog storage.

DETAILED DESCRIPTION

Figure 1:
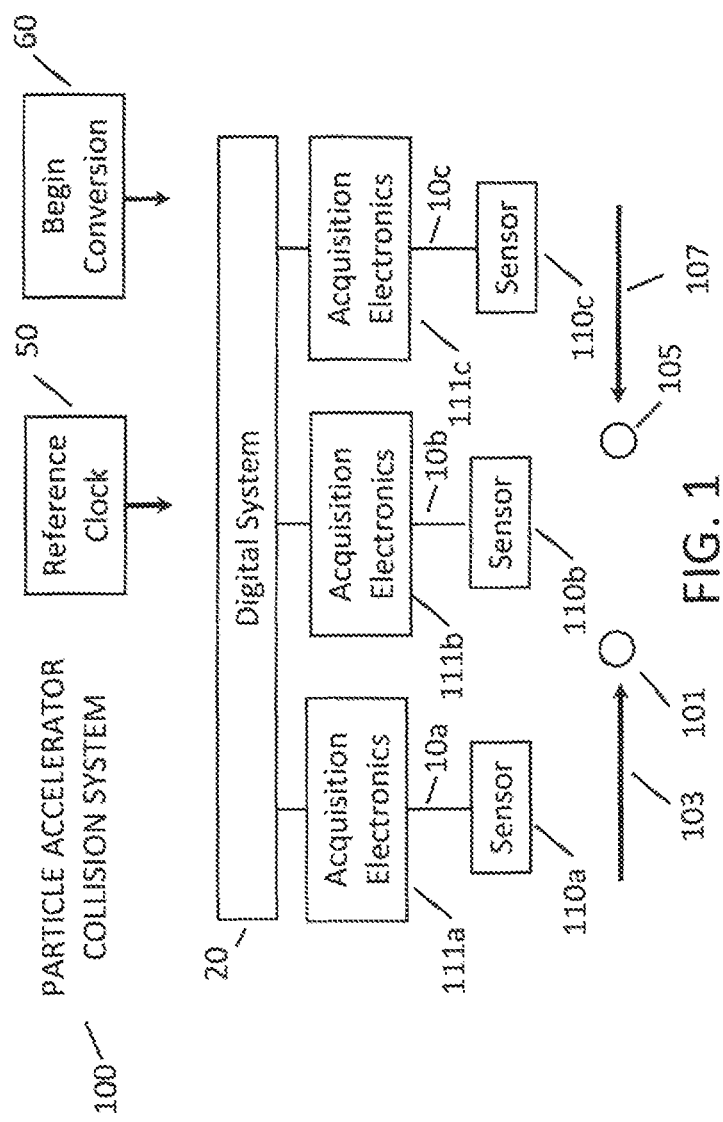
FIG. 1 illustrates a simplified block diagram of a Particle Accelerator System.

With reference to FIG. 1, functional blocks associated with the data acquisition portion of a particle accelerator system 100 are shown. Particles may be repeatedly propelled by an electric field through a circular pipe which may increase particle velocity. When a particle or particles reach the desired energy level, a target may be placed into their path where a particle collision detector may observe the collision. A particle collision detector may be comprised of a sensor 110a and acquisition electronics 111a. In some applications, a number of particle collision detectors may be utilized in the system 100. In an application, a first particle 101 with a first velocity 103 may collide with a target. In an application, the target may be a second particle 105 with second velocity 107. A first particle collision detector comprised of sensor 110a and acquisition electronics 111a, a second particle collision detector comprised of sensor 110b and acquisition electronics 111b, and a third particle collision detector comprised of sensor 110c and acquisition electronics 111c may be used to observe and record particles and radiation that may be produced by the collision. In an application, one particle collision detector may be utilized. In another application, a multiplicity of particle collision detectors may be used. In an application, over one thousand particle collision detectors may be used.

Figure 2:
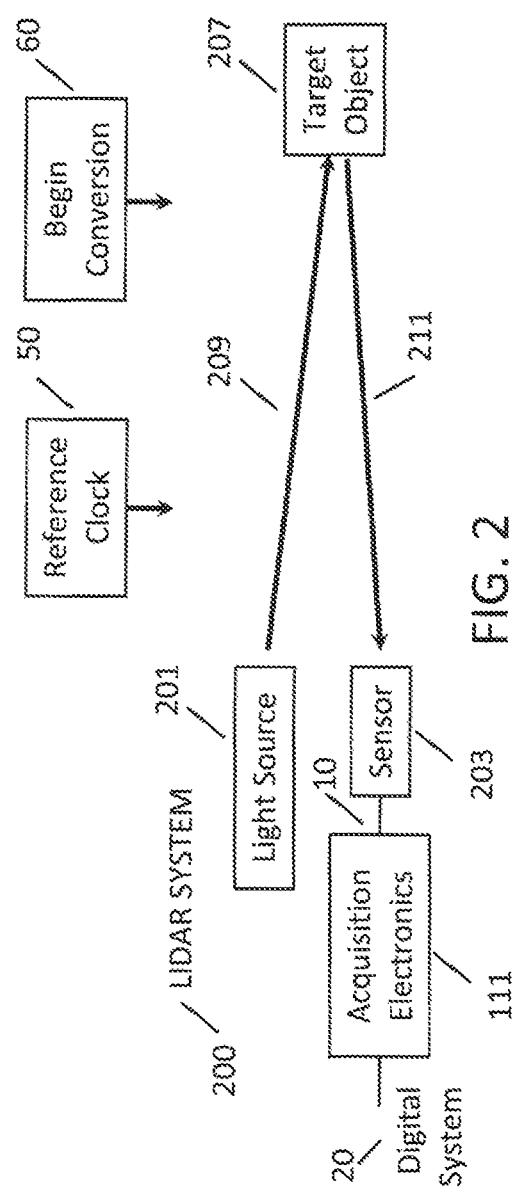
FIG. 2 illustrates a simplified block diagram of a Lidar System.

With reference to FIG. 2, a conceptual block diagram of a Lidar System 200 is shown. Lidar is a remote sensing method that uses light in the form of a pulsed laser to measure distances from a reference position to a Target Object 207. A Light Source 201 sends pulses of light that travels a first distance 209 to the Target Object 207. The light reflects off the Target Object 207 and travels a second distance 211 back to a Sensor 203 that outputs a signal representative of the detected reflected light to Acquisition Electronics 205. By measuring the time delay from when the Light Source 201 transmits the laser signal to when the reflected signal is received by the Sensor 203, an estimate of the distance of the Target Object 207 can be calculated. Since light travels approximately $3 \times 10^8$ meters/sec in vacuum or air, if a Target Object 207 is 300 meters from a light source 201, it takes approximately 2 microseconds for light sent from a light source 201 to reflect off a Target Object 207 and return back to a sensor 203. In an embodiment of a Lidar System 200, the Begin Conversion 60 signal may become active when the Light Source 201 transmits a pulse of light. Acquisition Electronics 205 may then be used to measure time from the Begin Conversion 60 signal transition to receiving the reflected light received by Sensor 203. The numbers used for the speed of light, distance of the object, and time delay are approximate and used to provide an example of the approximate time delays that may be measured by a Lidar system.

Applications such particle accelerator systems and Lidar systems may have a number of similarities. First, acquisition electronics 111 may have analog input 10 from a sensor, and digital output 20 which may be transferred to the digital system for further processing, storage, display, and other post processing operations. Second, a discrete observation period for observing the sensor data may be defined with a well-defined beginning and a well-defined end. There may be little or no value in evaluating the sensor data outside the observation period. And third, data may be sparse. A system in which data is sparse may be described as follows. During the majority of the observation period, the sensor output may be zero-valued or unchanging in value. When the sensors do receive non-zero or time-varying data, the period of time the data is non-zero or time-varying may be relatively short compared with the observation period.

In order to meet requirements for particle accelerator systems and Lidar systems, the data acquisition system may provide: a. Digitized data—active portions of the signal may be converted into digital representation with moderate resolution and high sample rate; In some applications, a resolution of 8-bits to 12-bits and sample rates between 200 MHz and 20 GHz may be used; Other applications may have differing requirements; Only the time-varying portion or active portion of the signal may be digitized; and b. Timing info—provide sufficient data to enable the identification of the position of a signal occurrence in time relative to a timing reference; Some applications may require timing accuracy on the order of tens of picoseconds; Other applications may have differing requirements; In an application, the system may convolve the received signal with the impulse response of the expected signal and enable accurate identification of the time position of the received signal relative to a timing reference. Other applications may utilize other methods for identification of the time position of the received signal relative to a timing reference.

With reference to FIG. 3 and FIG. 4, two approaches for handling sparse data are described. In FIG. 3, input 10 enters sampler 305 which generates discrete-time samples of the input. These samples are converted to the digital domain by the analog-to-digital converter (ADC) 307. These samples are passed to digital storage 306 and processed by digital processing block 309. Activity detector 350 identifies portions of the data containing data of interest 300. Data of interest 300 may include data that is time-varying. In applications where the sample rate is high, the ADC 307 may be implemented by a stand-alone analog-to-digital converter and digital storage 306 may be implemented by an external integrated circuit (IC) requiring high data-rate transfer at the interface 325 between ADC 307 and digital storage 306. The implementation challenges of systems with multiple buses between chips with transfer rates on the order of one-gigahertz may quickly increase for systems with large numbers of sensors.

In FIG. 4, the sampler 305 is followed by analog storage 306 before the ADC 307. Activity detector 350 operates on input 10 and may identify data of interest 300 stored in analog storage 306 before conversion to the digital domain by the ADC 307. This may allow only the stored samples containing data of interest 300 to be passed to the ADC 307. In applications where the data is sparse, this approach may significantly reduce the required transfer rate at the interface 325 since the average sample rate out of ADC 307 may be greatly reduced. This approach may significantly reduce the required ADC 307 conversion rate.

Figure 5:
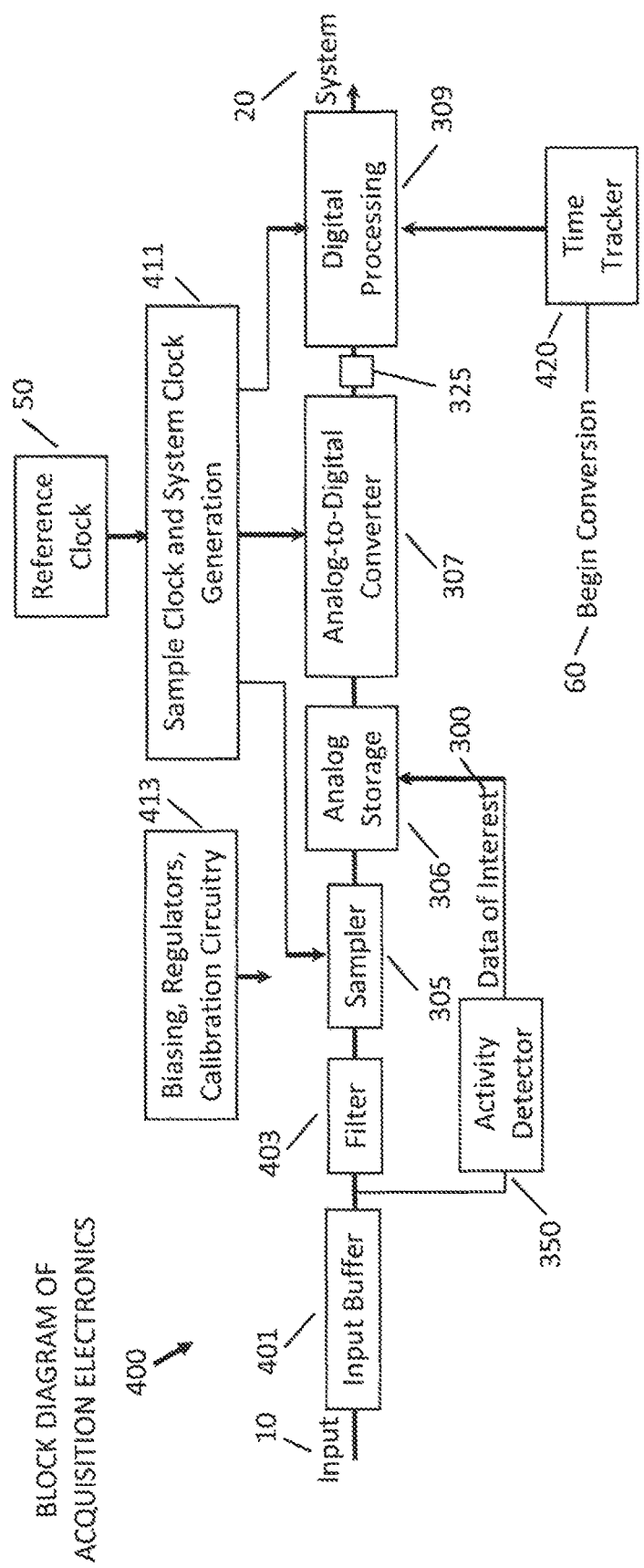
FIG. 5. illustrates a comprehensive block diagram of data acquisition electronics circuitry utilizing analog storage.

With reference to FIG. 5, a block diagram of acquisition electronics 400 employing analog storage is shown. Input 10 enters input buffer 401 which may provide impedance matching to the source impedance of the external sensor. Input buffer 401 may have a gain of unity, may provide amplification, or may provide attenuation. In an embodiment, the gain of the input buffer 401 may be variable. Some applications may use an explicit input buffer 401 while other applications may not use an explicit input buffer 401. In an embodiment, no explicit input buffer 401 may be used and filter 403 and activity detector 350 may be driven by an external source or the external sensor. Lowpass filter 403 may provide anti-alias filtering before sampling. Lowpass filter 403 may be an explicit filter implemented using components such as resistors and capacitors. Lowpass filter 403 may utilize a distributed filter structure using resistors and capacitors. Lowpass filter 403 may utilize an active filter architecture utilizing transistors and opamps. Lowpass filter 403 may not be an explicit circuit block but instead be implemented by the band-limiting characteristics of the external sensor or other circuitry in the signal path before the sampler 305. In an embodiment the lowpass filter 403 may have a cut off frequency of half of that of the sample rate.

Sampler 305 may sample the input signal 10 periodically and may generate discrete-time samples of the input signal. Sampler 305 may temporarily store samples using sampling elements. In an embodiment, the sampling frequency may be a constant frequency. In an embodiment, the sampling frequency may be between 200 mega hertz (MHz) and 20 giga hertz (GHz). In another embodiment, the sampling frequency may be greater than one-giga hertz. In yet another embodiment, the sampling frequency may be less than one-giga hertz. Sampler 305 may pass analog discrete-time samples to analog storage 306. Sampler 305 may be comprised of a multiplicity of sampling elements. Analog storage 306 may be comprised of a multiplicity of storage elements. Each sampling element may have a sample mode where the sampling element samples the input 10. The sampling element may have a transfer mode where the sampling element transfers the sampled value to an analog storage element. Each storage element may have a sample mode where the storage element receives a sampled value from a sampling element. The storage element may have a hold mode to store the sampled value. The storage element may have a transfer mode where the storage element transfers the stored value to the ADC 307. During the sampling element transfer mode, each sampling element may be coupled to one or more storage elements via a multiplexor that may connect each sampling element to one storage element at a time.

ADC 307 may convert the discrete-time analog signal from Analog Storage 306 to a digital representation. ADC 307 may have 8-12 bits of resolution. In an embodiment, the analog-to-digital converter 307 may have greater than 10 bits of resolution. In another embodiment, the analog-to-digital converter 307 may have fewer than 10 bits of resolution. Depending on the conversion rate requirements and the resolution requirements, the analog-to-digital converter 307 may utilize an appropriate architecture. In an embodiment, the analog-to-digital converter 307 may utilize a Wilkinson type architecture. In another embodiment, the analog-to-digital converter 307 may utilize a flash-converter architecture. In yet another embodiment, the analog-to-digital converter 307 may utilize a multi-step flash converter architecture. In another embodiment, another analog-to-digital converter architecture may be used.

The system may provide a Reference Clock 50 signal and a Begin Conversion 60 signal to acquisition electronics 400. The absolute timing of events relative to the Begin Conversion 60 signal may be important for some applications. In an embodiment, Begin Conversion 60 may start as a logic 0 signal and become active on a transition to a logic 1 signal. In another embodiment, the Begin Conversion 60 signal may be designated as change in duty cycle of another signal provided by the system to the data acquisition channel 50. In an embodiment, another method may be used to indicate the time reference from which to measure events wherein the method may be the equivalent of a Begin Conversion 60 signal becoming active. Begin Conversion 60 signal may be input to a Time Tracker 420 block wherein Time Tracker 420 may measure time with respect to Begin Conversion 60 becoming active.

Reference Clock 50 may be generated by a high stability clock source. For example, a temperature compensated crystal oscillator may be used to generate Reference Clock 50. The frequency of Reference Clock 50 may be much lower than the frequency of the sampler 305. For example, Reference Clock 50 may have a frequency of 25 MHz and the frequency of the sampler 305 may be 1 GHz. Sampling clock and system clock generation 411 may utilize phase-lock loops (PLLs) or delay-lock loops (DLL) to generate sampling clock phases and other system clocks much greater in frequency than the Reference Clock 50. Digital Processing block 309 may follow ADC 307 and an external integrated circuit (IC) requiring high data-rate transfer can be at the interface 325 between ADC 307 and digital storage 306. In an embodiment, the interface 325 can include low-voltage differential signaling or (LVDS) any other high speed interface mechanism. The implementation of digital processing block 309 may utilize one or more technologies including an FPGA, custom logic, a microprocessor or microcontroller, or a dedicated digital signal processor. Digital processing block 309 may implement linear and non-linear signal processing, and utilize memory. Digital processing block 309 may include signal processing functions such as gain control, filtering, and digital calibration or digital correction to correct or minimize the effect of implementation non-idealities such as offsets due to transistor mismatch, sampling non-uniformity, and noise. The digital signal processing block 309 may format data from the data acquisition electronics 400 and output the data to the system 20. The output of the digital processing 309 block to the System 20 may include digital representation of input samples and timing data of the samples informed by time tracker 420. The provision of digital samples and timing data of the samples may be combined to determine the position in time of a received signal relative to the begin conversion 60 signal. Correlation or matched filtering may be used to assist in identifying the time location of a received signal. Events acquired by the Acquisition Electronics 400 may occur for an observation period lasting a few microseconds or longer. The timing of an event identified as data of interest relative to Begin Conversion 60 may be identifiable by the system 20 with high accuracy. In an application, the timing of an event may be identifiable with accuracy on the order of picoseconds.

Figure 6:
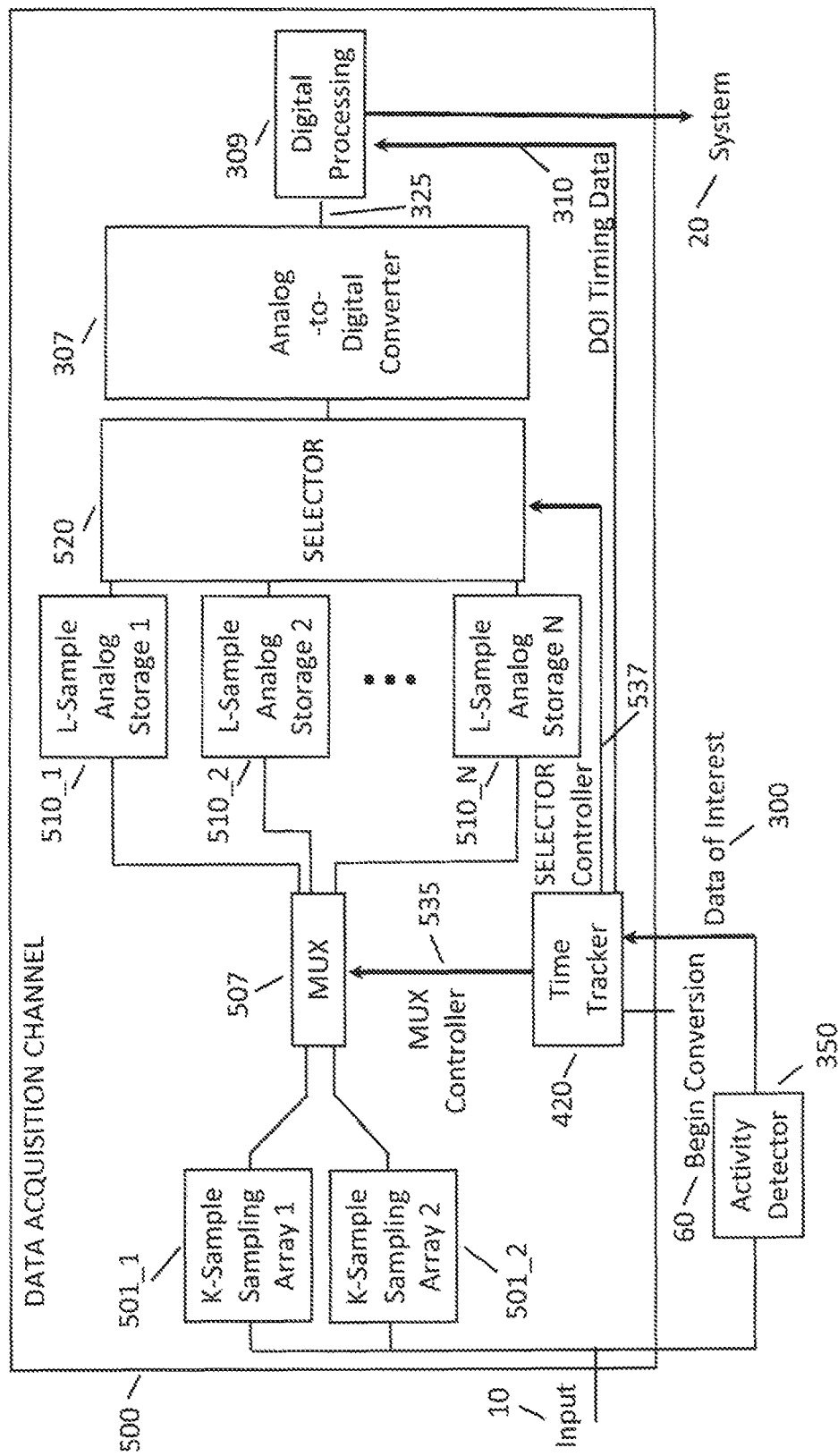
FIG. 6 illustrates a block diagram of a data acquisition channel utilizing analog storage employing time-interleaving and parallelism.

With reference to FIG. 6, a block diagram of a Data Acquisition Channel 500 is illustrated including time-interleaved K-Sample Sampling Arrays 501_1 and 501_2, N L-Sample Analog Storage blocks 510_1, 510_2, through 510_N, Time Tracker 420, and MUX 507. Input 10 from an Input Buffer drives the Data Acquisition Channel 500. Each K-Sample Sampling Array 501 samples the input signal at the input sample frequency. While K-Sample Sampling Array 501_1 is sampling the input, K-Sample Sampling Array 501_2 may be transferring recently acquired K-Samples to an L-Sample Analog Storage block 510 which may be comprised of L analog storage circuits through MUX 507. In an embodiment, K may be equal to L and each of the multiplicity of L analog storage circuits within the L-Sample Analog Storage block 510 may be configured to receive one of the input samples taken by one of the sampler circuits within one of the K-Sample Sampling Arrays 501. If there are an even number of L-Sample Analog Storage blocks 510 (N even), then K-Sample Uniform Sampler 501_1 may connect, alternately, with the first N/2 L-Sample Analog Storage blocks which may include 510_1, 510_2, on up through 510_N/2, and K-Sample Uniform Sampler 501_2 may connect, alternately, with a second set of N/2 L-Sample Analog Storage blocks which may include 510_N/2+1, 510_N/2+1, on up through 510_N. In the remainder of this description, we shall assume K is equal to L.

Time Tracker 420 may generate MUX Controller signal 535, SELECTOR Controller signal 537, and DOI (Data of Interest) Timing Data 310. MUX Controller 535 receives the MUX controller signal 535 and may control the transfer of Sampling Array 501 samples to the Analog Storage blocks 510. SELECTOR Controller signals 537 are received by the selector 520 which may control the transfer of samples in Analog Storage blocks 510 to the Analog-to-Digital Converter 307. DOI Timing Data 310 may inform Digital Processing 309 of the timing data associated with digitized samples identified as containing Data of Interest 300. The Begin Conversion signal 60 may be input to the Time Tracker 420. When Begin Conversion signal 60 is received, the Time Tracker 420 may begin counting sampling periods of Sampling Array 1 501_1 and Sampling Array_2 501_2. Begin conversion 60 may be synchronized with reference clock 50 to time align the start of sampling of Sampling Array 501 with the transition of begin conversion 60 to the active state.

Activity detector 350 identifies activity in the input signal 10, may identify Data of Interest 300, and may inform the Time Tracker 420 when Data of Interest 300 is identified. The activity detector 350 may operate synchronized with the operation of Sampling Array 1 501_1 and Sampling Array_2 501_2. This may enable activity detector 350 to identify when Data of Interest 300 may be contained in samples from Sampling Array 1 501_1 or Sampling Array 2 501_2. There may be latency between the sampling period of Sampling Array 1 501_1 or Sampling Array 2 501_2 and the generation of Data of Interest signal 300 associated with a specific sampling period. This latency may be accounted for by the Time Tracker 420. The selector 520 can transfer the samples in Analog Storage blocks 510 to the Analog-to-Digital Converter 307 and the Analog-to-Digital Converter 307 can convert the analog sample data into digital sample data. The digital signal processing block 309 may format digital sample data and output the data to the system 20.

Figure 7:
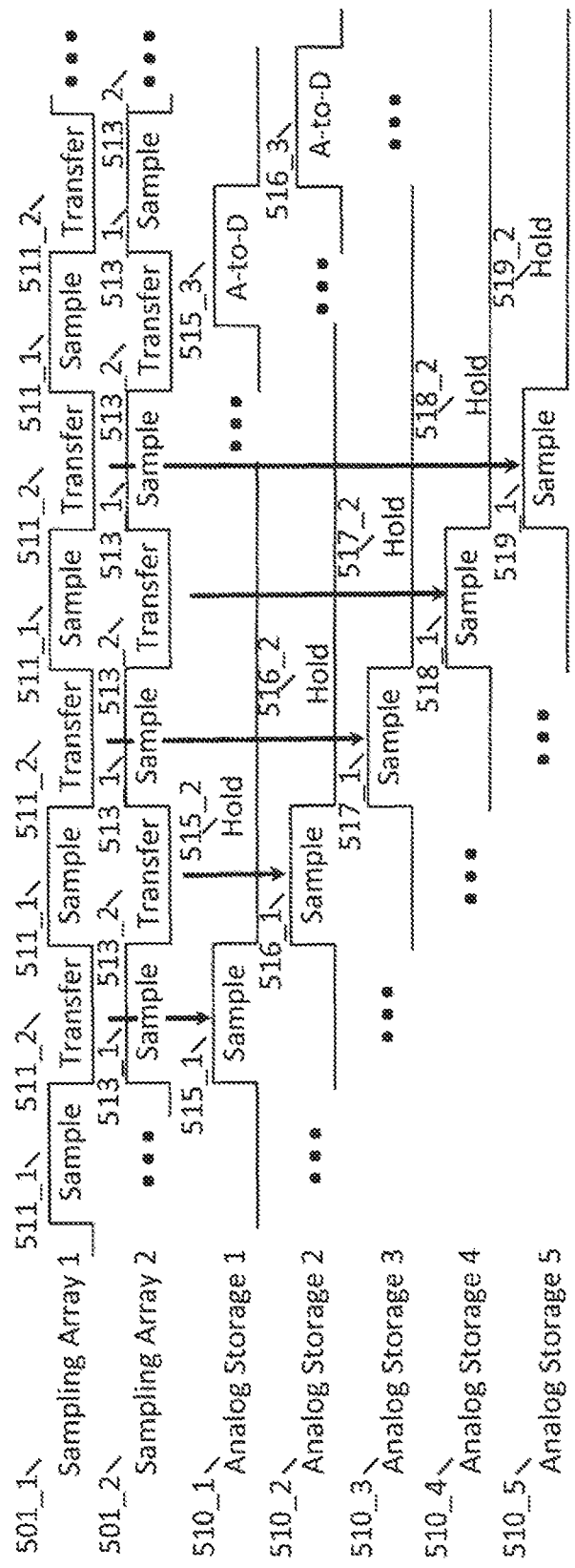
FIG. 7 illustrates a timing diagram for the channel shown in FIG. 6.

With reference to FIG. 7, the functional timing of Sample Array 1 501_1 and Sample Array 2 501_2 with Analog Storage Block 1 510_1 through Analog Storage Block 5 510_5 is shown. Sample Array 1 501_1 and Sample Array 2 501_2 operate in a time-interleaved manner. When Sample Array 1 501_1 is sampling 511_1 the input signal, Sample Array 2 501_2 is transferring 513_2 samples taken during the previous sampling phase 513_1 to the next stage Analog Storage block. When Sample Array 1 501_1 is transferring 511_2, Sample Array 2 501_2 is sampling 513_1. Sampling Array 1 501_1 may transfer to Analog Storage 1 510_1 while Analog Storage 1 510_1 is in sample 515_1 mode. Following this, Analog Storage 1 510_1 may enter hold 513_2 mode. When selected, samples held by Analog Storage 1 510_1 may be connected to the analog-to-digital converter (307 shown in FIG. 6) during 515_3.

Figure 8:
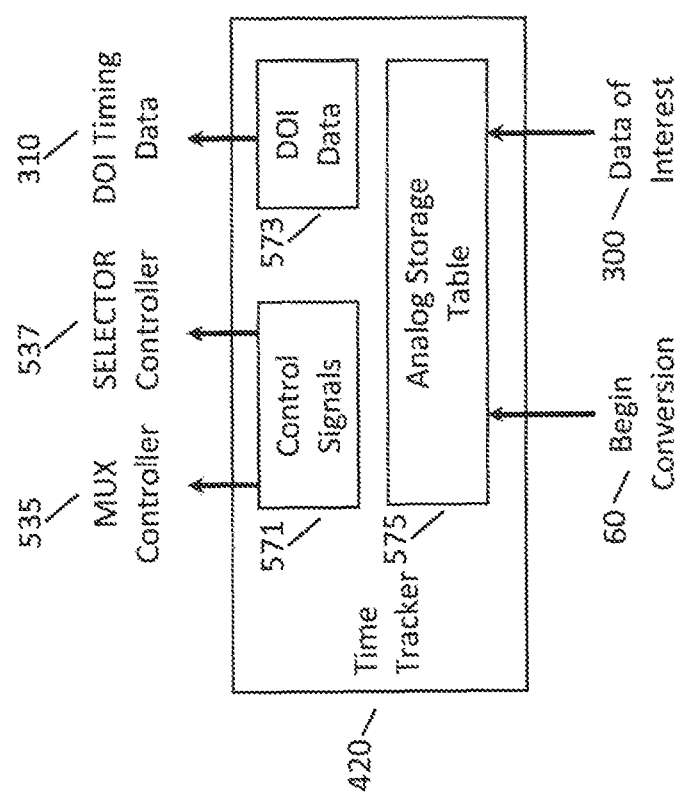
FIG. 8 illustrates an embodiment of a Time Tracker.

With reference to FIG. 8, an embodiment of a Time Tracker 420 is shown. Inputs may include the Begin Conversion 60 signal and the Data of Interest 300 signal and these signals may be used to fill entries in Analog Storage Table 575. Control Signals 571 block may generate outputs MUX Controller 535 and SELECTOR Controller 537, while the DOI Data 573 block may generate and output DOI Timing Data 310.

Figure 9:
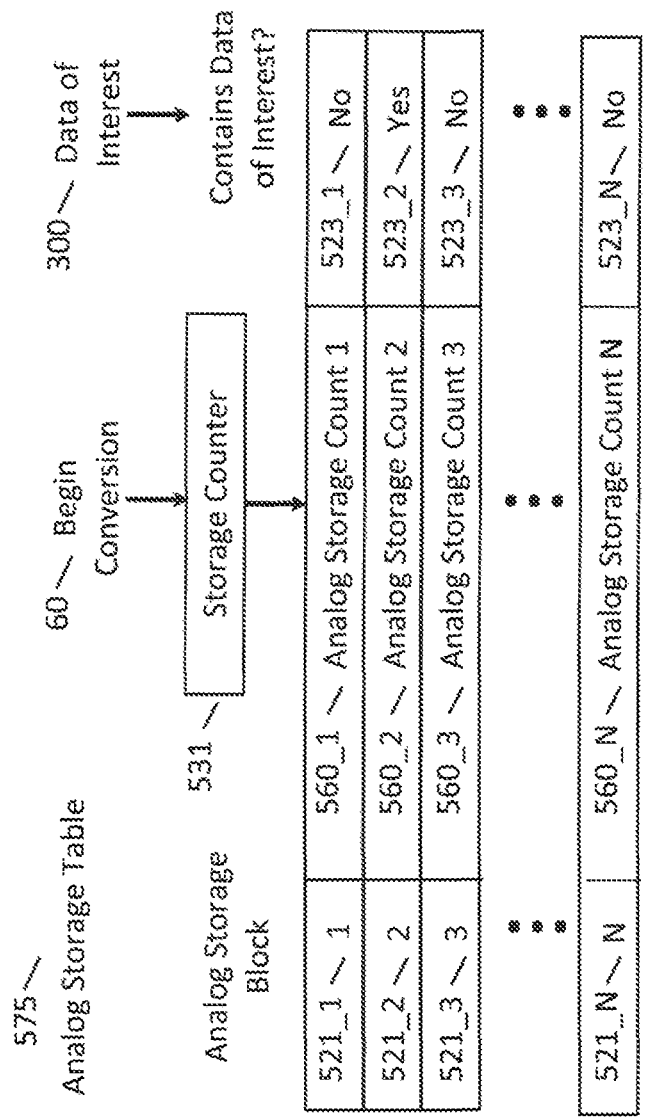
FIG. 9 illustrates a look-up table implementation of the Storage Index used in a Time Tracker.

With reference to FIG. 9, an embodiment of Analog Storage Table 575 is shown. The first column in Analog Storage Table 575 may contain storage row numbers. Each Analog Storage block 510_1 through 510_N may be assigned a storage row number 521_1 through 521_N. Analog Storage block 1 510_1 may be assigned row number 521_1, Analog Storage block 2 510_2 may be assigned row number 521_2, Analog Storage block 3 510_3 may be assigned row number 521_3, and so forth. The second column may contain an analog storage count 560_1 through 560_N corresponding to the number of count periods relative to the Begin Conversion 60 signal. The third column may contain bits 523_1 through 523N corresponding to whether or not the analog storage block has been identified to contain Data of Interest 300. In an embodiment, Analog Storage Table 575 may be implemented in another portion of the system 20.

Figure 10:
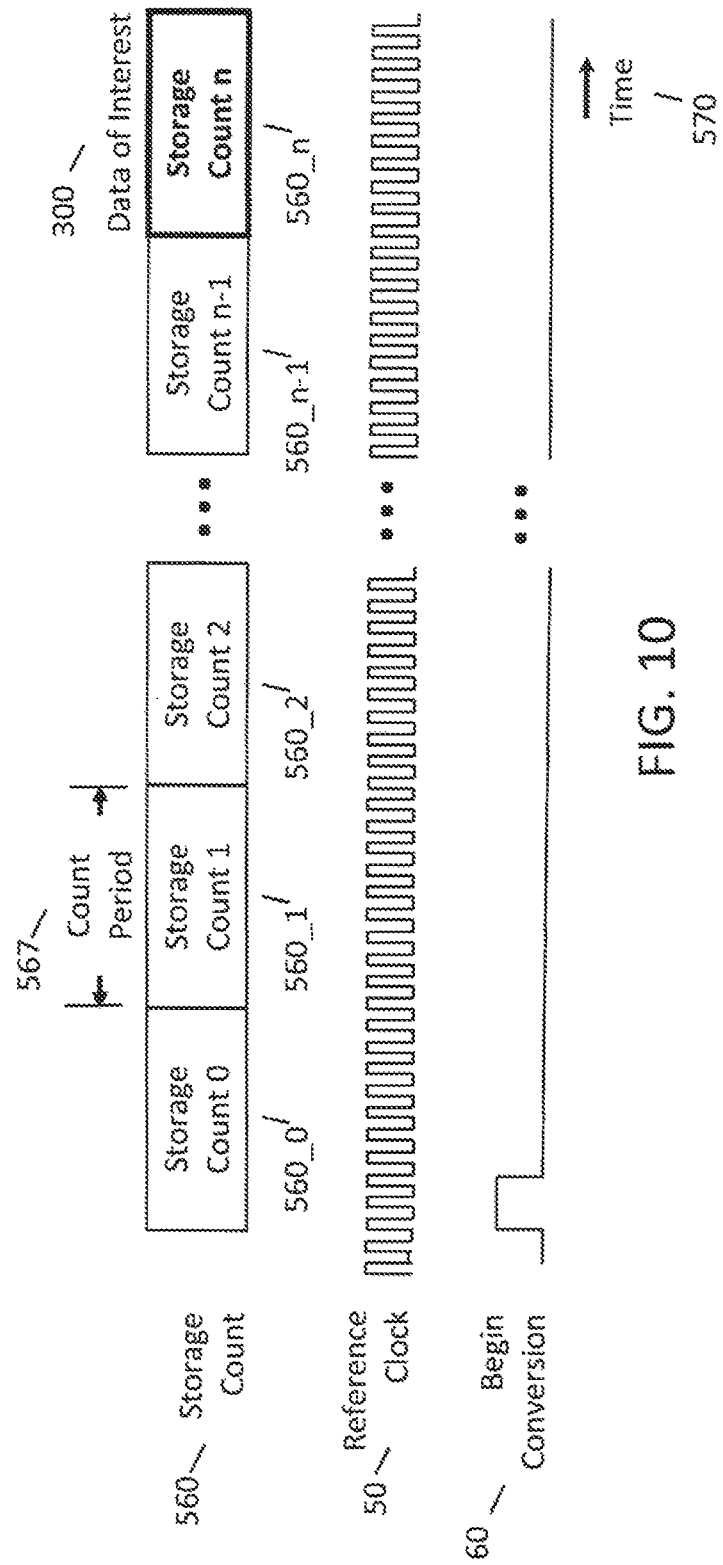
FIG. 10 illustrates the operation of Storage Count for supporting the identification of time between a Storage Block containing Data of Interest and the Begin Conversion signal.

With reference to FIG. 10, an embodiment illustrating the operation of resetting Storage Counter 531 to zero and incrementing the Storage Count 560 for each Analog Storage Block number 521_1 through 521_N is shown. When Begin Conversion 60 signal transitions from logic 0 to logic 1, storage counter 531 is reset to 0 on the next rising edge of the reference clock 50. Reference clock 50 is then counted and after the appropriate predetermined number of reference clock 50 cycles, the storage counter 560_0, 560_1, 560_2, . . . is incremented. The count period 567 can be based upon the appropriate predetermined number of reference clock 50 cycles. In the example shown, Data of Interest 300 is identified at Storage Count n 560_n. This data is used to update the Analog Storage Table (575 shown in FIG. 9) to enable the Time Tracker 420 to treat the corresponding analog storage block appropriately.

Figure 12:
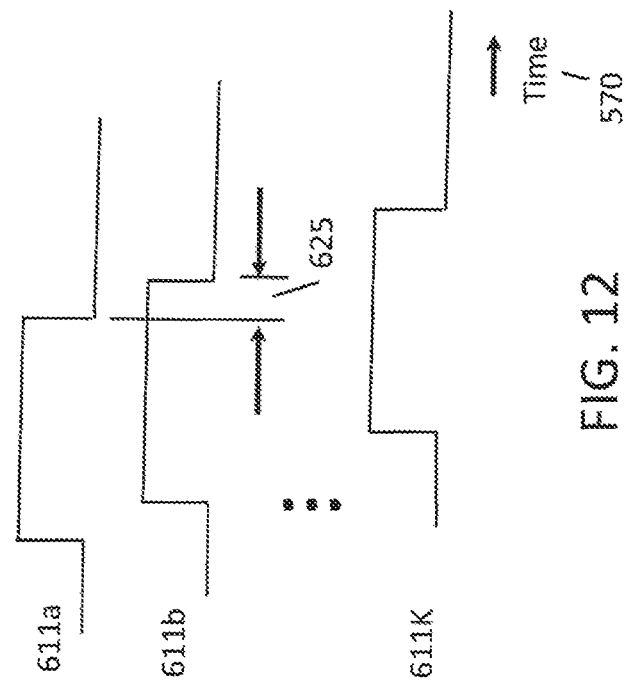
FIG. 12 illustrates timing waveforms that drive sampling switches that define a high sampling frequency in the sampling array.
Figure 11:
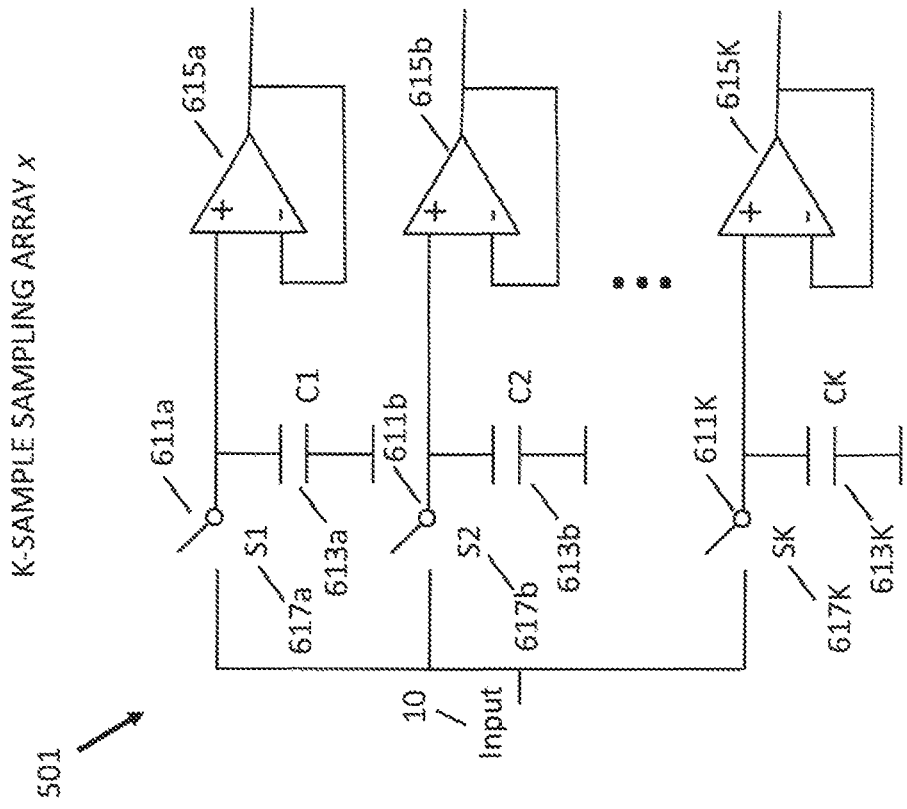
FIG. 11 illustrates an implementation of a sampling array that samples and then transfers samples to a following stage.

A circuit diagram of an embodiment of a K-Sample Uniform Sampler (501_1 and 501_2) is illustrated in FIG. 11 with switch control sampling clocks illustrated in FIG. 12. The K-Sample Uniform Sampler 501 may be comprised of K parallel sampling circuits which take samples of the input in uniform time intervals. Each sampling circuit may include a sampling switch S1 617a controlled by sampling signal 611a. Sampling switch S1 617a may be off when the sampling signal 611a is in logic level 0 and on when the sampling signal 611a is in logic level 1. The input may be sampled onto sampling capacitor C1 613a when the sampling signal 611a transitions from logic level 1 to logic level 0. This transition of the sampling signal from a logic level 1 to a logic level 0 turns off switch 611a may define a sampling instant. The input sample sampled onto capacitor C1 613a may be buffered by amplifier 615a configured in a unity gain configuration. Each of the K parallel sampling circuits of FIG. 11 may utilize a corresponding sampling clock from FIG. 12. Sampling switch S1 617a may be controlled by sampling clock 611a, sampling switch S2 617b may be controlled by sampling clock 611b, and so forth. The time delay 625 between sampling clock 611a and 611b defines a sampling period where the inverse of the sampling period is equal to the sampling frequency. By generating sampling clocks using controllable delay elements, very high effective sampling frequencies may be achieved. For example, a current starved inverter may be designed and controlled to have a delay of five-hundred picoseconds. Current starved and non-current starved inverters may be placed in cascade to create a non-inverting circuit with one nanosecond of delay. By placing a number of such circuits in series, a sequence of sampling instants may be defined with an effective sampling period of one nanosecond and effective sampling frequency of one gigahertz.

Amplifier 615a may be implemented using a number of different circuit topologies in which the gain is constant or nearly constant. In an embodiment, amplifier 615 may be implemented by an opamp in unity gain. In an embodiment, amplifier 615 may be implemented by a voltage follower or a source follower circuit. In an embodiment, amplifier 615 may be implemented by a source follower circuit with the body or bulk of the transistor tied to the source of the transistor. In another embodiment, other circuit topologies may be used to implement amplifier 615. The sampling cap C1 613a may utilize a metal-oxide-metal or a MOM cap structure. Sampling cap C1 613a may utilize a metal-insulator-metal or a MiM cap structure. Sampling cap C1 613 may use a MOS cap structure. Any intrinsic or parasitic capacitance or combinations of intrinsic and parasitic capacitances may be used to implement sampling capacitor C1 613. While switch S1 617 is shown as sampling on the top plate of capacitor C1 613, bottom plate sampling techniques may be used in order to minimize signal dependent charge injection. The circuit topology is shown single-ended. In an embodiment, fully differential circuit architectures may be used. The bottom plate of sampling cap C1 613 is shown connected to GND or VSS. Each of the design choices including the voltage on the bottom plate of the sampling cap C1 613 may be selected as necessitated by implementation considerations of the overall circuit, with considerations including technology node, transistor thresholds, resolution requirements, sample-rate requirements, trade-offs between different performance metrics, and cost.

Figure 13:
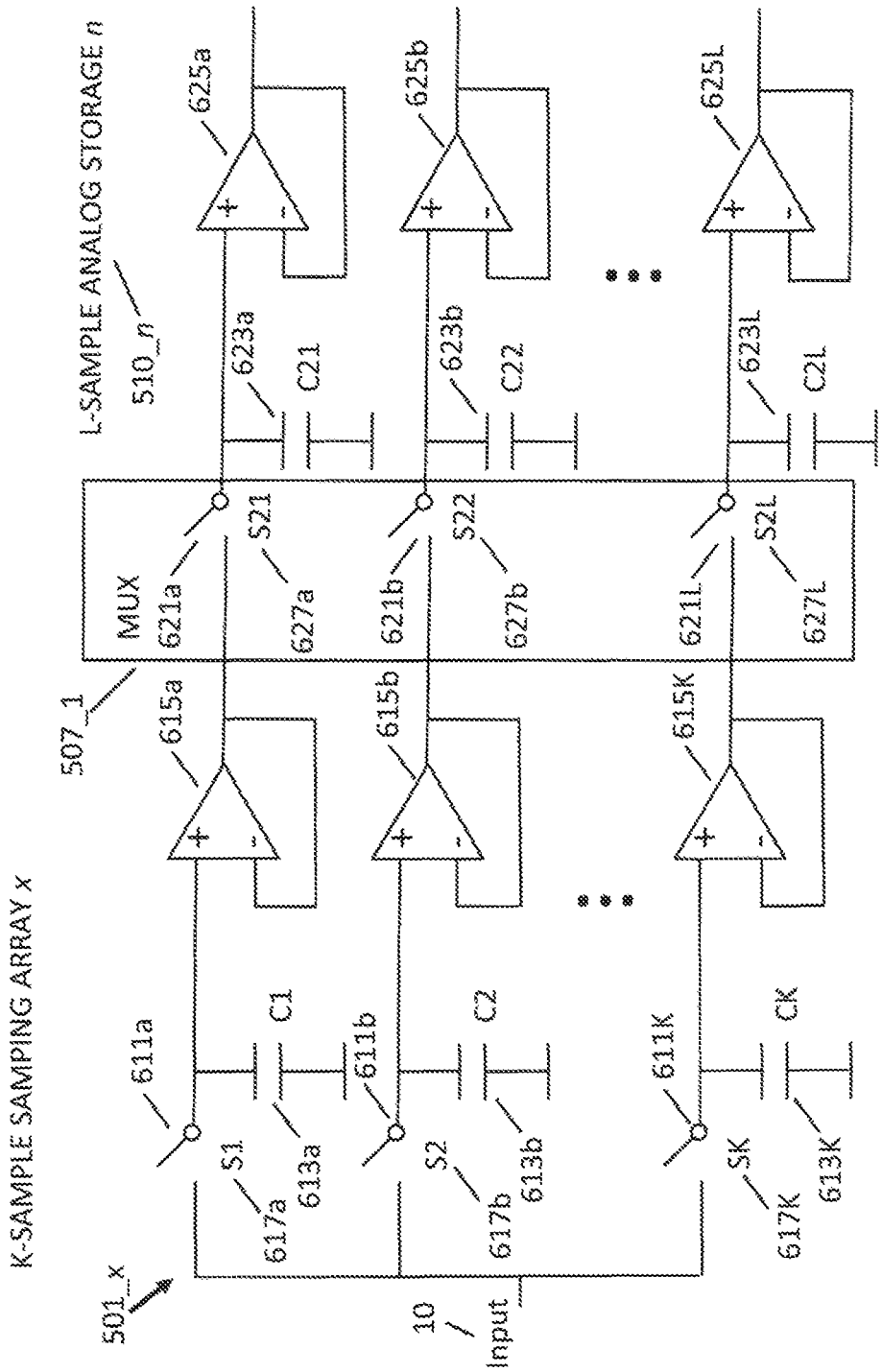
FIG. 13 illustrates how the sampling array transfers samples to the analog storage.

With reference to FIG. 13, the outputs of the K-Sample Uniform Sampler 501 are shown connected to the inputs of the L-Sample Analog Storage 510 block. Multiple L-Sample Analog Storage 610 blocks may be connected to the output of the K-Sample Sampling Array 501 as described earlier. The L-Sample Analog Storage 510 block may be comprised of L Analog Sample-and-Hold circuits. An Analog Sample-and-Hold circuit may include a sampling switch S21 627a which may connect storage capacitor C21 623a to Sampling Array 501 buffer amplifier 615a output. The sampling switch S21 627a can be part of a multiplexer 507 which is driven by timing signal 621a. The sampling switch S21 627a may be off when the timing signal 621a is in logic level 0 and on when the timing signal 621a is in logic level 1. The storage capacitor C21 623a may be followed by a buffer amplifier 625a which may drive the analog-to-digital converter input. Similar circuit topologies may be used for buffer amplifier 625 as may be used for the buffer amplifier 615 in the K-Sample Sampling Array 501 block. In addition, similar capacitor structures may be used for the hold capacitors C21 623a through C2L 623L. Bottom plate sampling techniques may also be utilized in the hold capacitor implementation to minimize signal dependent charge injection. For some applications, simpler circuit topologies may be utilized to save silicon area at the cost of performance degradation due to non-idealities such as signal dependent charge injection.

Figure 14:
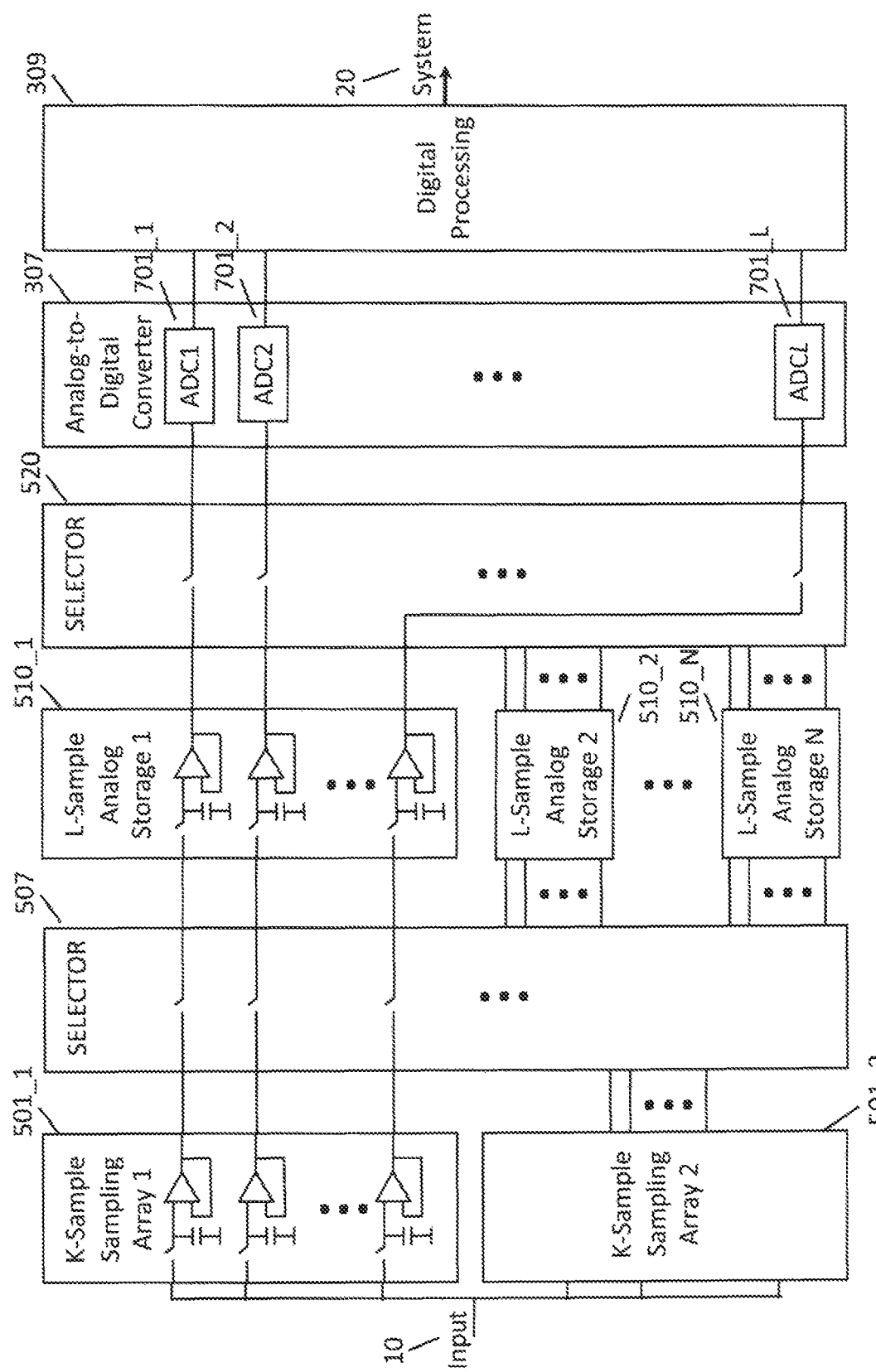
FIG. 14 illustrates the extension of parallelism from the sampling array to the analog storage, and then on through the analog-to-digital converter.

With reference to FIG. 14, an embodiment of the analog-to-digital converter employing parallelism is shown. An input 10 is coupled to K Sample Sampling Arrays 501_1, 501_2 which are coupled to a selector 507. The selector controls the data transmitted to the Analog Storage 510 blocks. An Analog Storage 510 block may be implemented with L analog storage cells. The outputs of the Analog Storage 510 blocks are transmitted to a selector 520 which controls the data transmitted to the ADC 307. In an embodiment, each of the analog storage cells may drive one of L parallel analog-to-digital converters (701_1 through 701_L). In an embodiment, an analog-to-digital converter utilizing a single-ramp analog-to-digital converter architecture may be utilized. This converter architecture can be implemented in a small amount of area and is relatively low current. The enabling of parallelism in the analog-to-digital converter implementation is a significant advantage in this architecture since it enables the use of an analog-to-digital converter implementation that is small in die size and low in current.

The digital data from the ADC 307 is processed by digital processing 309 and an output is transmitted to system 20.

Figure 15:
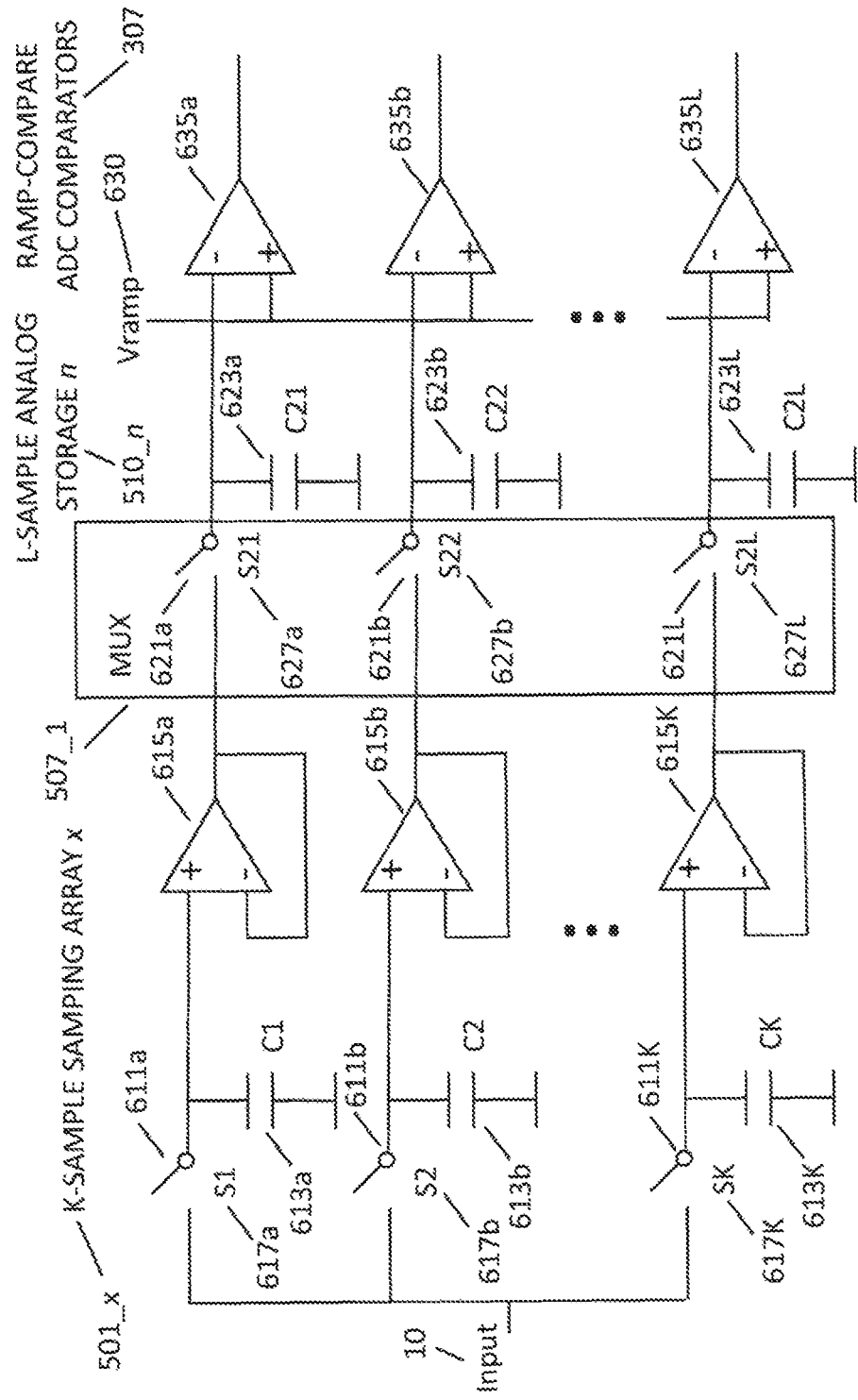
FIG. 15 illustrates the an implementation of the analog-to-digital converter utilizing a single-ramp analog-to-digital converter architecture.

With reference to FIG. 15, an embodiment utilizing a ramp-compare analog-to-digital converter is shown. Buffers 625a through 625L as shown in FIG. 13 are replaced with comparators 635a through 635L each of which functions as the comparator of a ramp-compare analog-to-digital converter. In an embodiment, explicit selector 520 switches (shown in FIG. 14) may not be needed. Instead, comparators 635a through 635L may be enabled or disabled to effectively implement the selector function. This example may illustrate the flexibility of the architecture to utilize aspects of function or block implementations to simplify or optimize the overall system implementation.

Figure 16:
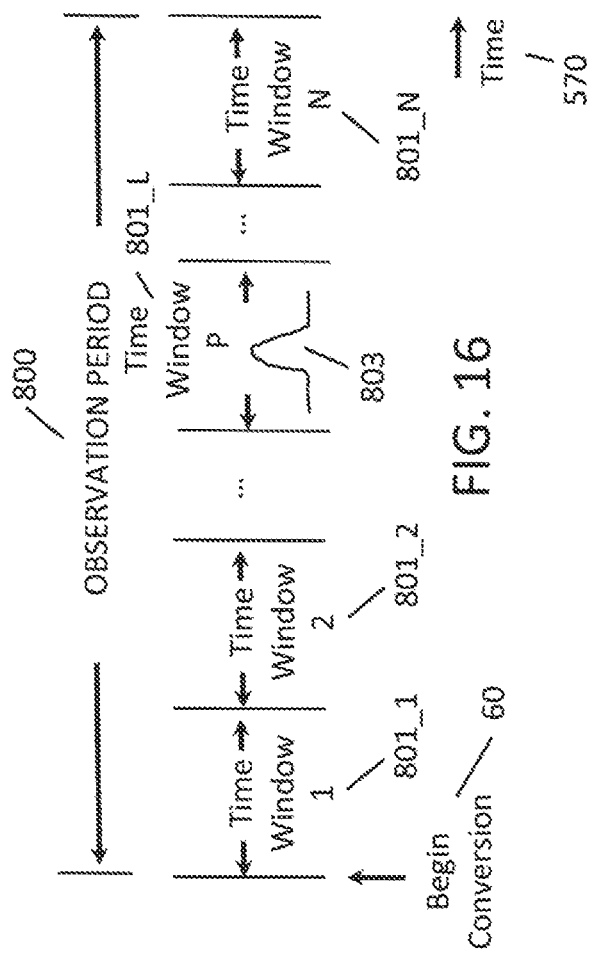
FIG. 16 illustrates the time duration of an observation period comprised of a number of time windows.

With reference to FIG. 16, a diagram of time windows 801 over time 570 is illustrated. Begin Conversion 60 signal becoming active is indicated in the lower left. This may define the beginning of Observation Period 800. The Observation Period 800 may define a period of time on the order of the maximum time duration of interest for the system. In an embodiment, the Observation Period 800 may be 0.1 to 16 microseconds. In another embodiment, the Observation Period 800 may be greater than 2.5 microseconds. In yet another embodiment, the Observation Period 800 may be less than 2.5 microseconds. The Observation Period 800 may be comprised of a multiplicity of Time Windows 801 beginning with Time Window 1 801_1, followed by Time Window 2 801_2, on up through Time Window N 801_N. In each period of Time Window 801, L contiguous equally spaced samples of the input may be acquired.

In an application, most of the time windows 801_1 through 801_N may be zero valued or unchanging in value corresponding to the absence of a data signal received by the sensor. An unchanging non-zero value may be considered a background value. In the example, Time Window L 801_L may indicate time-varying values as illustrated by a transient pulse 803. In an embodiment, time-varying data meeting a set of specified criteria may identify a Time Window 501 as containing Data of Interest. In the example shown, Time Window L 801_L may contain Data of Interest. Specified criteria may depend upon the application. For example, in an application, specified criteria may include a change in data value compared with the background value must exceed a threshold. In another application, additional specified criteria may be used. In an application, other disqualifying criteria may be used to negate a Time Window 801 as containing Data of Interest. More than one Time Window 801 may contain Data of Interest. In an application, when a Time Window 801 may be identified to contain Data of Interest, neighboring time windows before or after the Time Window 801 may be identified as containing Data of Interest. In an application, the system may utilize machine learning techniques to identify Time Windows 801 containing data of interest. In an application, the system may utilize artificial intelligence to identify Time Windows 801 containing data of interest.

With reference to FIGS. 6 and 9, the Analog Storage Table 575 may maintain a record of which analog storage blocks 510_1 through 510_N that may contain Data of Interest 300. In applications where data is sparse, many of the analog storage blocks 510_1 through 510_N may be identified to not contain Data of Interest 300. In an embodiment, the system may be implemented with a sufficient number of analog storage blocks 510_1 through 510_N to span the entire observation period 800. In an embodiment where the data is known to be sparse, the system may be implemented with fewer analog storage blocks 510 than is needed to span the entire observation period (800 FIG. 8). Time Tracker 420 may govern utilization of the analog storage blocks 510 and allow a storage block identified to not contain Data of Interest 300 to be re-used during the same observation period. Reuse of storage blocks 510 when identified not to contain Data of Interest 300 during an observation period 800 may result in significant hardware savings.

Figure 17:
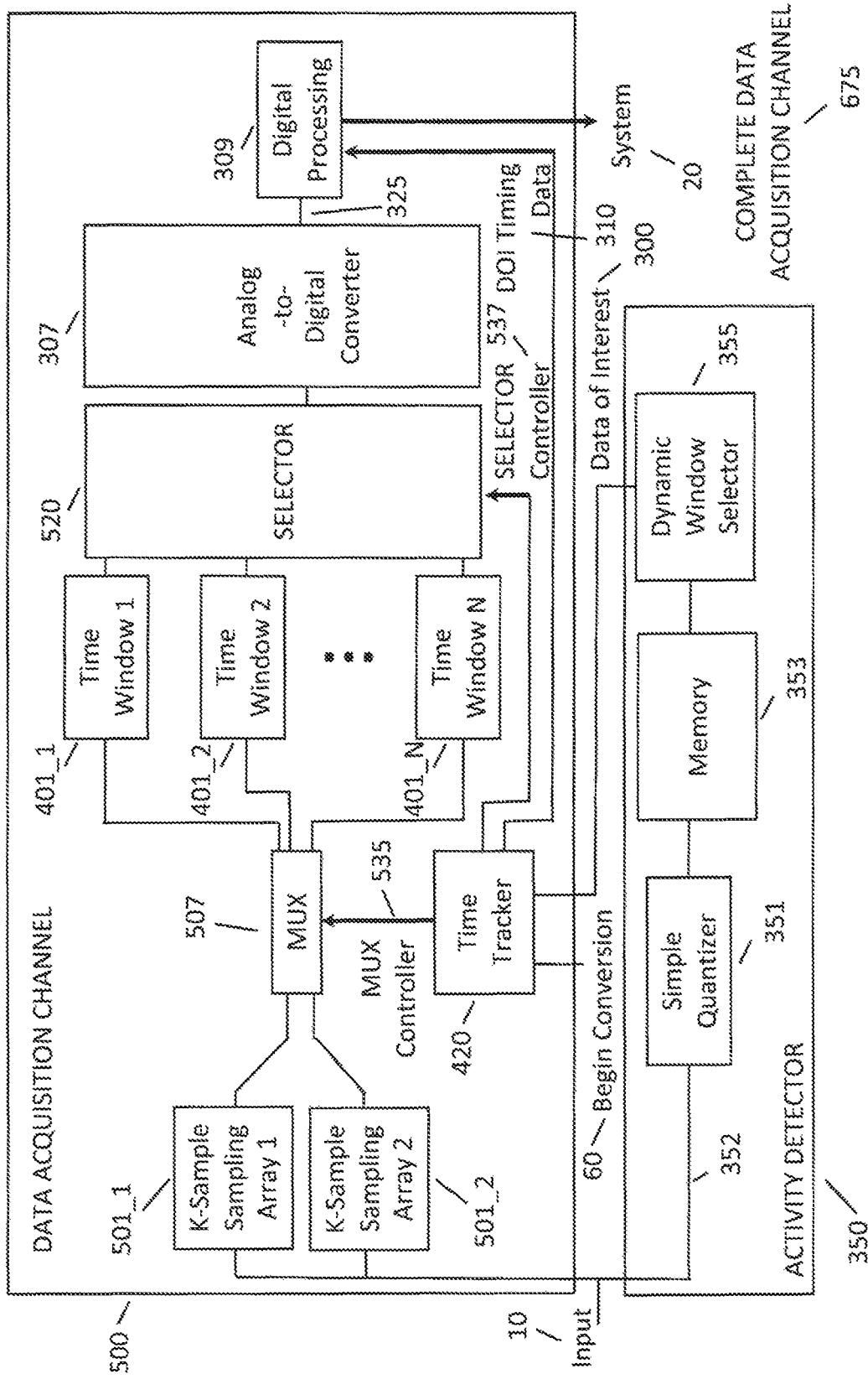
FIG. 17 illustrates a block diagram of a data acquisition channel with an activity detector wherein the activity detector provides control to select time windows for analog-to-digital conversion.

With reference to FIG. 17, an embodiment of an Activity Detector 350 is shown together with Data Acquisition Channel 500 previously described in FIG. 6. However, rather than L-Sample Analog Storage, the Activity Detector 350 may identify time windows 401_1 through 401_N containing Data of Interest 300. An embodiment of Activity Detector 350 may include a Simple Quantizer 351, memory 353, and a Dynamic Window Selector 355. Simple Quantizer 351 may perform an analog-to-digital conversion of the input 10. Memory 353 may be used to store one or more samples of the input 10. The input sample or samples in memory 353 may be used by an algorithm running on a processor in the Dynamic Window Selector 355 to identify data of interest 300. Since the activity detector 350 may be used primarily to identify activity in the input 10 signal, the Simple Quantizer 351 may use a lower sampling rate and fewer bits of resolution than the analog-to-digital converter in the Data Acquisition Channel 500. For example, the Simple Quantizer 351 of the activity detector 350 may use a sampling rate of 200 MHz to 20 GHz and a resolution of 1-6 bits. In an embodiment, the Simple Quantizer 351 may be implemented by a flash converter. In an embodiment, the Simple Quantizer 351 may be implemented by a comparator. In an embodiment, other high-speed quantization methods may be used in the implementation of the Simple Quantizer 351.

With reference to FIGS. 7 and 17, since latency from input to output of the Activity Detector 350 may be accounted for by the Time Tracker 420, the Activity Detector 350 need not operate at the sample 511_1 and transfer 511_2 rate of Sampling Array 1 501_1 and the sample 513_1 and transfer 513_2 rate of Sampling Array 2 501_2, allowing parallelism and pipelining to be utilized in the implementation of the Activity Detector 350.

The Dynamic Window Selector 355 algorithm may utilize one or more samples from the Simple Quantizer 351 to identify data of interest 300. Memory 353 depth may depend on the algorithm used by the dynamic window selector 355 wherein the amount of memory 353 required can be proportional to the complexity and computational requirements of the algorithm.

Dynamic Window Selector 355 may identify data of interest by utilizing an algorithm optimized for the application. In an embodiment, analog correlation may be utilized wherein the input signal is passed through a matched filter with an impulse response configured for the application. The impulse response may identify a target pulse shape. In an embodiment, the matched filter may be implemented as a continuous-time filter. In an embodiment, the matched filter may be implemented as a discrete-time switched-capacitor analog filter with weighted capacitors to implement an impulse response and employ parallelism.

The Dynamic Window Selector 355 may be implemented by custom logic, programmable logic, a microprocessor, a microcontroller, or a digital signal processor. In an embodiment, machine learning techniques may be used to train the dynamic window selector 650. In an embodiment, artificial intelligence may be used to train the dynamic window selector 650. In an embodiment, other techniques and methods may be used to train the dynamic window selector 650.

Figure 18:
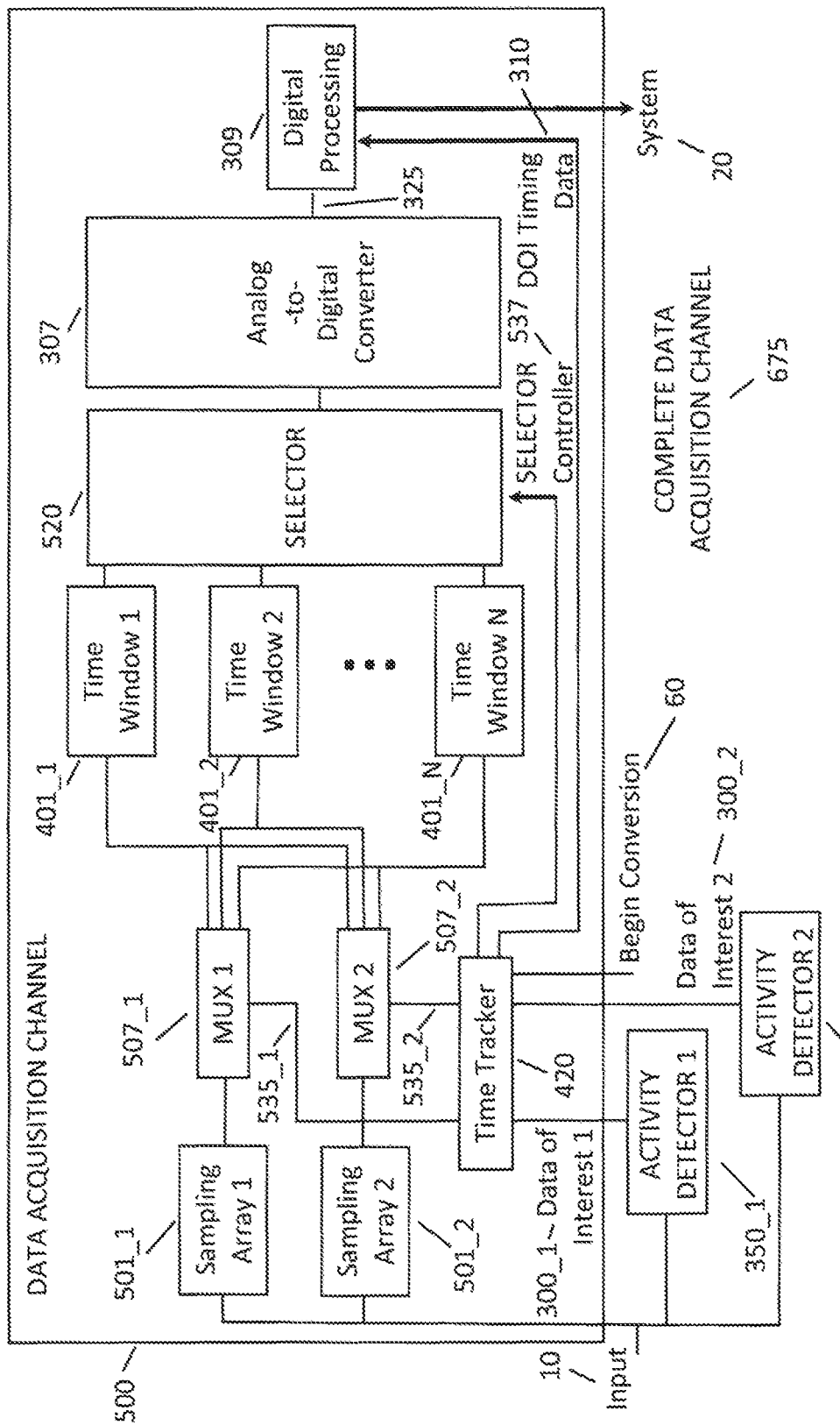
FIG. 18 illustrates a block diagram wherein each sampling array has a dedicated activity detector.

With reference to FIG. 18, another embodiment of a data acquisition system is illustrated. In this embodiment, Sampling Array 1 501_1 may have dedicated MUX 1 507_1 and Activity Detector 1 350_1, and Sampling Array 2 501_2 may have dedicated MUX 2 507_2 and Activity Detector 2 350_2. Data of Interest 1 300_1 and Data of Interest 2 300_2 may be used by Time Tracker 420. This partitioning of input 10 and data of interest 300_1, 300_2 may lead to a simpler implementation of the data acquisition system mechanisms. The remaining system components including the time windows 401, selector 520, ADC 307 and digital processing 309 are the same as described above in FIG. 17.

Figure 19:
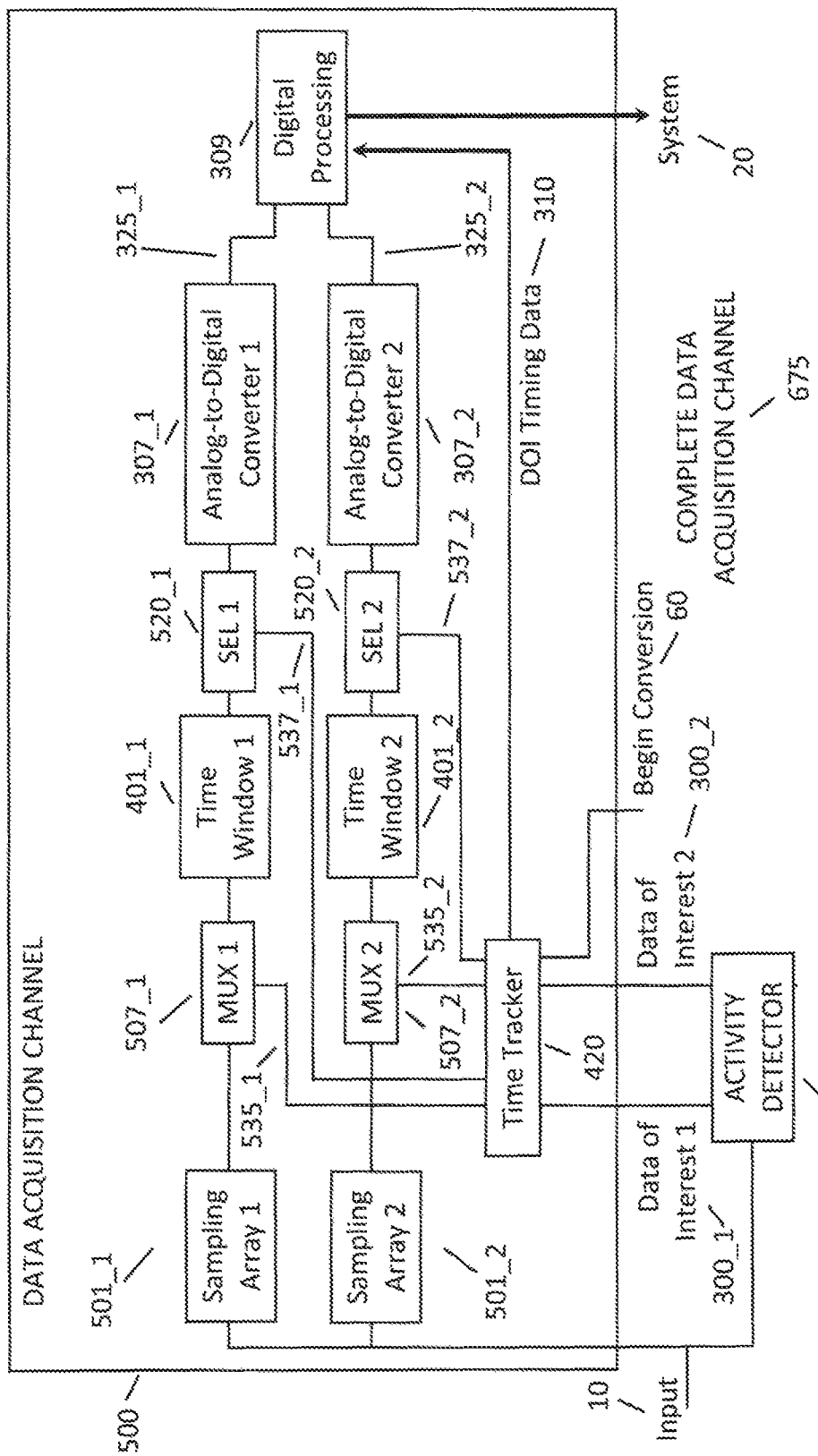
FIG. 19 illustrates a simplification of the block diagram under certain application conditions.

The requirements of specific applications may govern sample rates, analog-to-digital converter bit resolution requirements, and may specify statistics of the expected input signal including the amount of active signal expected during an observation period. The specific requirements may be used to optimize the implementation and can result in reduced hardware requirements, which may translate to hardware savings. With reference to FIGS. 7 and 19, an architecture illustrating a significant reduction in hardware is shown. This reduction may be possible under the following conditions: a. The Activity Detector 350 is able during the transfer mode 511_2 of Sampling Array 1 501_1 or during the transfer mode 513_2 of Sampling Array 2 501_2 to identify Data of Interest 300 and transfer samples to the respective Time Window 401; and b. The Analog-to-Digital Converter 1 307_1 is able to sample the analog samples stored in Time Window 1 401_1 while Sampling Array 1 501_1 is in sample mode 511_1, and able to perform the analog-to-digital conversion at an adequate rate such that no Time Windows containing Data of Interest is lost, and the Analog-to-Digital Converter 2 307_2 is able to sample the analog samples stored in Time Window 2 401_2 while Sampling Array 2 501_2 is in sample mode 511_2, and able to perform the analog-to-digital conversion at an adequate rate such that no Time Windows containing Data of Interest is lost. In an embodiment of FIG. 19, parallelism and pipelining may be utilized in the analog-to-digital converter implementation. This example illustrates the flexibility of the architecture to exploit specific details of an application to result minimize hardware and implementation complexity.

The functions of the data acquisition channel 500 and activity detector 350 may be implemented on a single chip as a mixed-signal system-on-a-chip (SOC). With reference to FIG. 4, additional support functions such as biasing 413, sample clock and control system clock generation 411, supply regulation, and structures for electro-static discharge (ESD) as shown on FIG. 4 may be included. In addition to SOC integration, other techniques and methods may be utilized to increase system integration including chip-on-board and multi-chip module (MCM) technologies. The addition of technologies such as FLASH memory or one-time programming (OTP) may also be integrated into the SOC or MCM. FIG. 17 through FIG. 19 illustrate architectures that may be used in the implementation of Data Acquisition Channel 500 and Activity Detector 350. The presented ideas may be used separately, in part, or in combination to achieve the desired implementation objectives.

Figure 20:
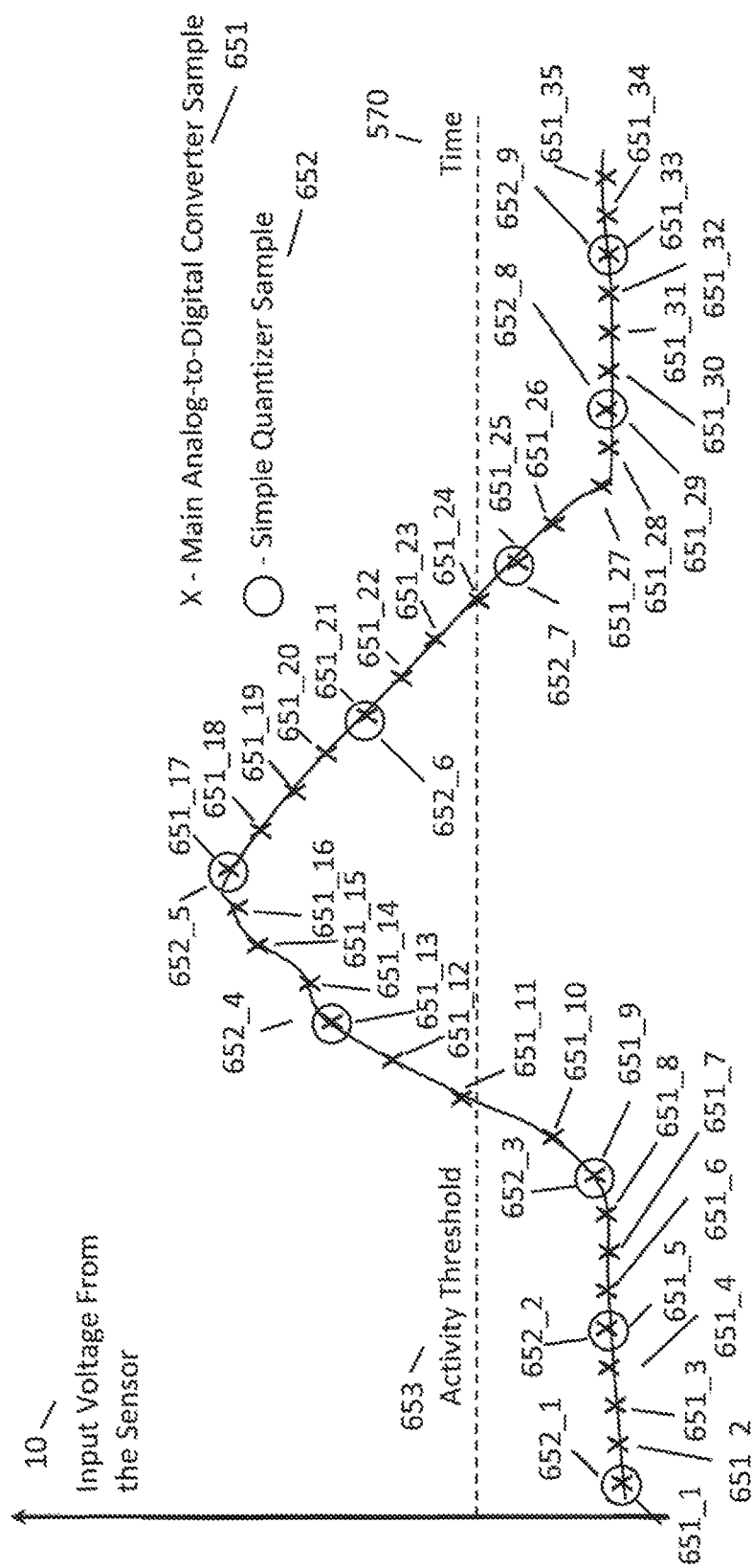
FIG. 20 illustrates an example input signal versus time illustrating the lower sampling rate of a Simple Quantizer compared with the sampling rate of the main analog-to-digital converter.
Figure 21:
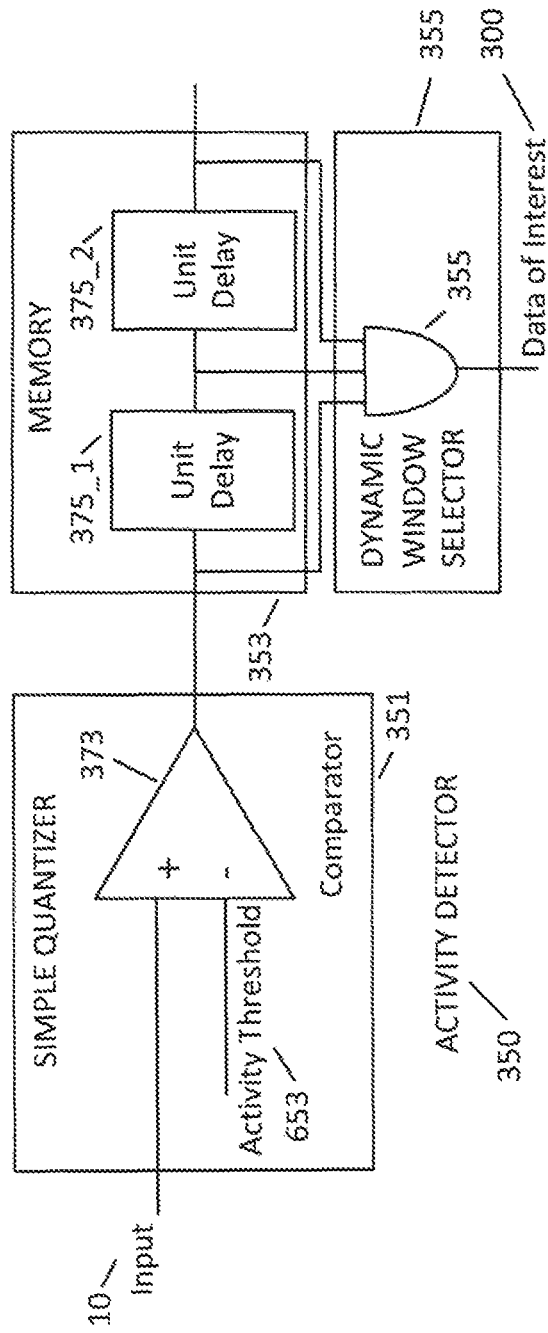
FIG. 21 illustrates an embodiment of an Activity Detector.

With reference to FIG. 20 and FIG. 21, an example of the operation of an embodiment of the Activity Detector 350 is shown. In FIG. 20, input signal 10 which can be an electrical voltage signal from the sensor is plotted versus time 570 together with the Activity Threshold 653, sampling instants of the Main Analog-to-Digital Converter 651_1 through 651_35, and the Simple Quantizer sampling instants 652_1 through 652_9. Note that in this example, the Simple Quantizer sampling frequency is one-fourth the Main Analog-to-Digital Converter sampling frequency. There are three Simple Quantizer samples 652_4, 652_5, 652_6 that are greater in magnitude than the Activity Threshold 653. The other Simple Quantizer samples 652_1, 652_2, 652_3, 652_7, 652_8, 652_9 are lower in magnitude than the Activity Threshold 653.

As discussed above in some embodiments, the data acquisition system can be used with a particle accelerator to record data from sensors detecting particle collisions. Upon a collision the sensor output may be a transient that for example may have a Gaussian or bell curve type shape which can lasts for several samples. The received pulse can be correlated by the data acquisition system with a filter to interpolate the exact location in time which can be time accurate to 10 s of picoseconds.

In FIG. 21, Simple Quantizer 351 is implemented with a comparator 373.

When input 10 is greater than the Activity Threshold 653, the comparator 373 output is a logic 1. Otherwise, when input 10 is lower than the Activity Threshold 653 the comparator 373 output is a logic 0. Memory 353 contains two unit delays 375_1 and 375_2. Each unit delay 375_1, 375_2 is equal to the Simple Quantizer 351 sampling period. These unit delays 375_1 and 375_2 may be several times the main path sampling time period. In an embodiment, the Dynamic Window Selector 355 can observe three samples in memory 353. The Dynamic Window Selector 355 algorithm identifies input data as Data of Interest when three contiguous samples of the Simple Quantizer 351 exceed the Activity Threshold 653. More complex algorithms and simpler algorithms may be used to implement the Activity Detector 350 depending on the requirements of the application.

Figure 22:
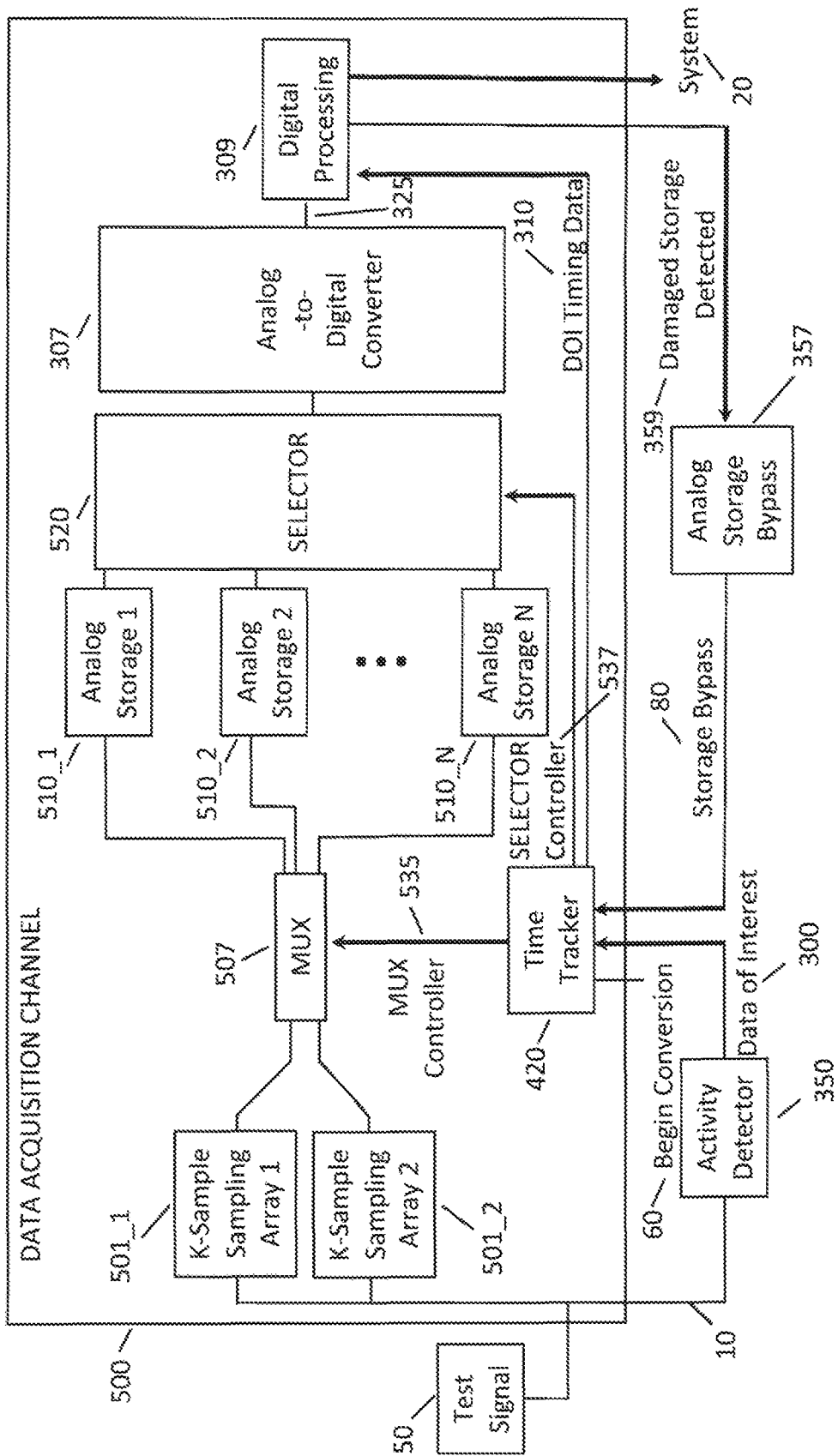
FIG. 22 illustrates a block diagram of an acquisition channel wherein damaged analog storage blocks may be bypassed.

The environment that electronics used in particle accelerator systems may be rich in high velocity subatomic particles. These high velocity particles may strike and damage storage cells. If an Analog Storage block with a damaged storage cell can be identified and more than the minimum number of Analog Storage blocks are available in the system, the Analog Storage blocks with damaged storage cells may be bypassed. One embodiment of an Acquisition Channel 675 with Damaged Storage Element Bypass is shown in FIG. 22. During an off-line test period, a Test Signal 50 may be applied to the input 10. This signal may be a DC value. The system may process the input signal as described above with reference to FIG. 6 and bypass any damaged storage elements. A properly working Analog Storage 510 block may convert to the digital domain through the analog-to-digital converter 307 substantially the same digital value. However, a damaged Analog Storage 510 block may result in one or more digital outputs that deviate from the others by a substantially large amount. By detecting an outlier output with a substantial deviation in value, the Digital Processing 309 block may identify a damaged Analog Storage 510 block, and a Damaged Storage Detected 359 signal may inform the Analog Storage Bypass 357 block of the ID of the damaged block. The ID may be kept in Analog Storage Bypass 357 or Time Tracker 420. Together, the Analog Storage Bypass 357 and Time Tracker 530 420 may ensure the damaged analog storage 510 block is no longer used by the acquisition channel 500. The Damaged Storage Element Bypass test can be performed at startup or intermittently when the system allows. If flash memory is available, the IDs of damaged Analog Storage 510 blocks may be stored in the flash memory.

Figure 23:
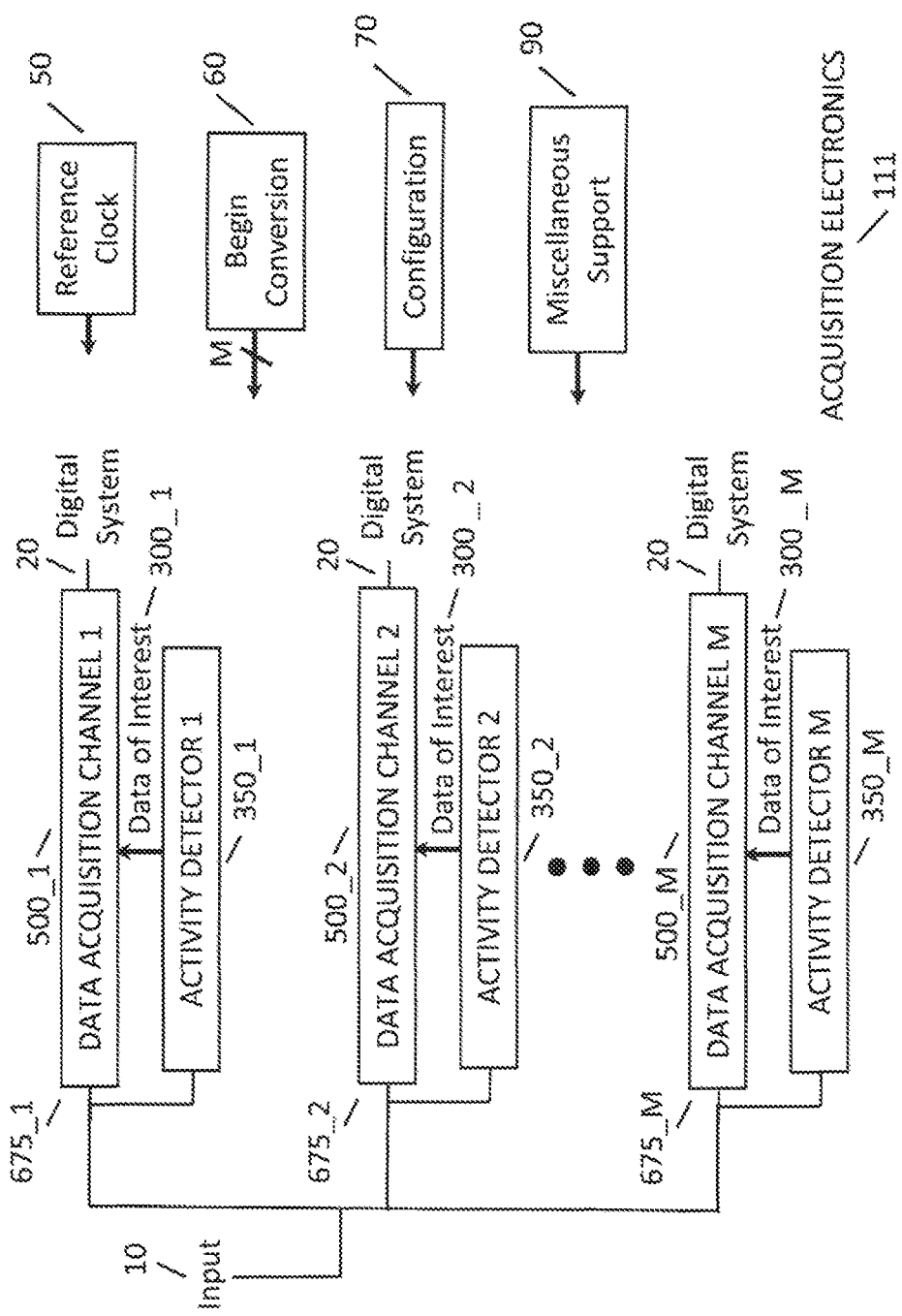
FIG. 23 illustrates a block diagram of acquisition electronics wherein independent acquisition channels may be configured to operate in different coordinated manners of operation.

A multiplicity of Complete Data Acquisition Channels 500 may be combined to implement a high integration solution. With reference to FIG. 23, M Complete Data Acquisition Channels 501_1 through 501_M coupled to input 10 are shown and may comprise a high integration solution. In addition to the System Clock 50 and Configuration 70 control signals to determine the operating configuration, up to M Begin Conversion 60 signals may be input to identify the time reference for each of the M Complete Data Acquisition Channels 500. This may result in a highly flexible structure that may be easily reconfigured for different applications.

Figure 24:
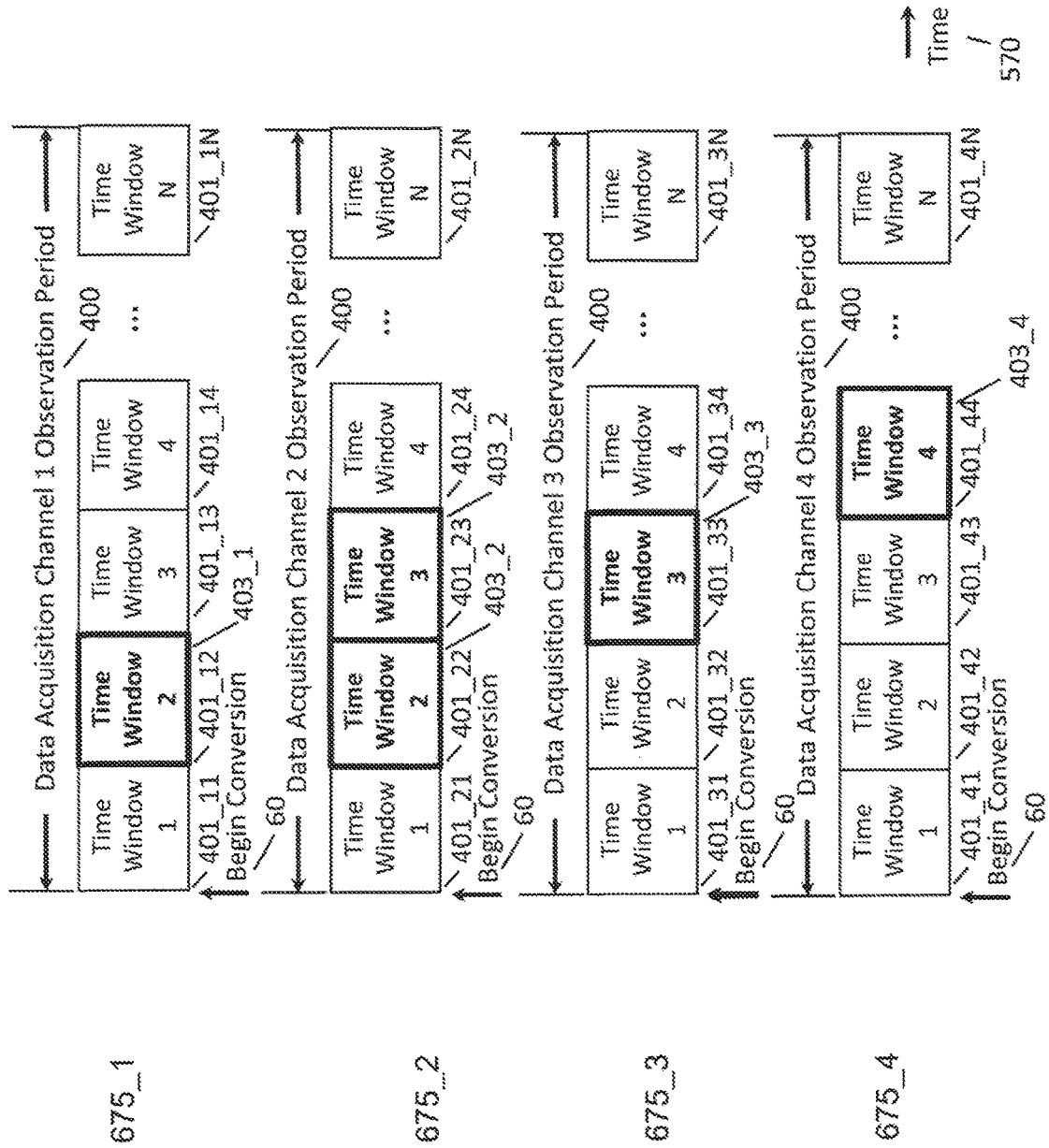
FIG. 24 through FIG. 28 illustrate different coordinated manners of operation of the block diagram of FIG. 23.
Figure 25:
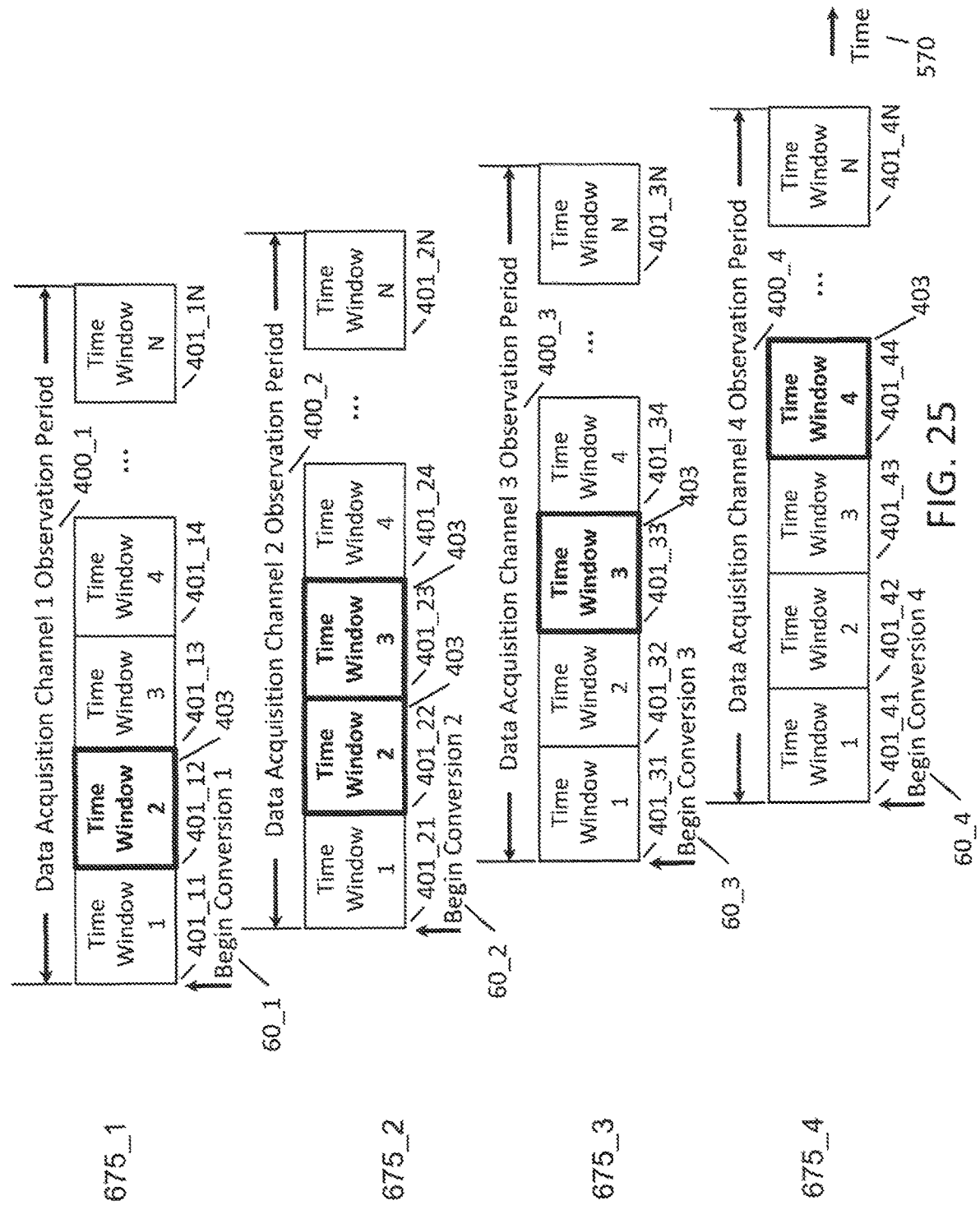
Figure 26:
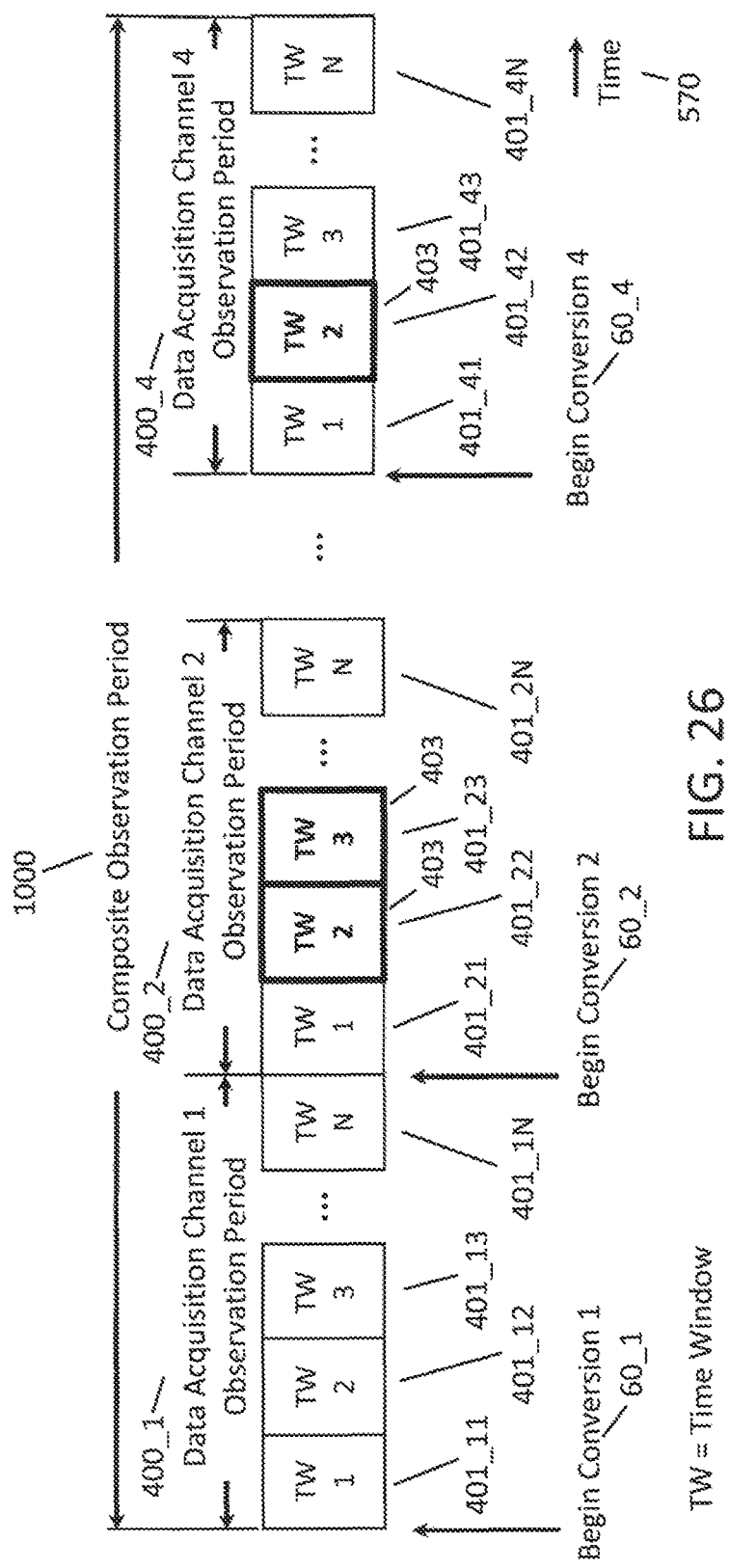

With reference to FIG. 24-FIG. 26, three operating examples of a system with four (M=4) Complete Data Acquisition Channels 675_1 through 675_4 are presented. In FIG. 24, the same Begin Conversion signal 60 is input to each of the Complete Data Acquisition Channels 675. This results in each of the channels beginning with the same time reference and sharing the same observation period (800 shown in FIG. 8). Independent Activity Detectors 350_1 through 350_4 may independently identify Time Windows containing Data of Interest for each of the Complete Data Acquisition Channels 675. The time windows containing data of interest are shown with bold lines and font. The time window containing data of interest for Channel 1 675_1 is identified as 403_1. The time windows containing data of interest for Channel 2 675_2 are identified as 403_2. This convention for identifying time windows containing data of interest is used for FIG. 24 through FIG. 28.

In FIG. 25, each Complete Data Acquisition Channel 500 is provided an independent Begin Conversion 60 signal. Data Acquisition Channel 1 500_1 may utilize Begin Conversion 1 60_1, Data Acquisition Channel 2 675_2 may utilize Begin Conversion 2 60_2, Data Acquisition Channel 1 675_3 may utilize Begin Conversion 3 60_3, and Data Acquisition Channel 4 675_4 may utilize Begin Conversion 4 60_4. To illustrate, Begin Conversion 1 60_1 is the first Begin Conversion 60 signal to become active. Then, each of the Begin Conversion signals Begin Conversion 2 60_2, Begin Conversion 3 60_3, and Begin Conversion 4 60_4 become active in sequence delayed by approximately one-half of a Time Window. Independent auxiliary paths may identify Time Windows containing Data of Interest 403 for each of the Complete Data Acquisition Channels 500.

With reference to FIG. 26, in an application where the maximum duration of interest for the system may exceed the Observation Period 400 of one data acquisition channel 675, a number of data acquisition channels 675 may be operated in a serial manner to extend the effective Observation Period 400 of a multiplicity of acquisition channels 675. For example, a first data acquisition channel 675_1 may be operated and cover a first observation period 400_1. When the first observation period 400_1 is ended, a second acquisition channel 675_2 may begin operation to start acquiring data for a second observation period 400_2. In an embodiment in which the Observation Period 400 is 2.5 microseconds, four acquisition channels 675 may be used to implement a composite observation period 1000 of 10 microseconds. Begin Conversion 1 60_1 is the first Begin Conversion Signal 60 to become active. Just as the Data Acquisition Channel 1 Observation Period 400_1 comes to an end, the Begin Conversion 2 60_2 signal becomes active. In an embodiment, timing may be coordinated in order for continuous sampling of the input signal to continue from Data Acquisition Channel 1 Observation Period 400_1 through Data Acquisition Channel 2 Observation Period 400_2. This operating pattern may be repeated to have Data Acquisition Channel 3 Observation Period 400_3 follow Data Acquisition Channel 2 Observation Period 400_2, and finally Data Acquisition Channel 4 Observation Period 400_4 follows Data Acquisition Channel 3 Observation Period 400_3.

Figure 27:
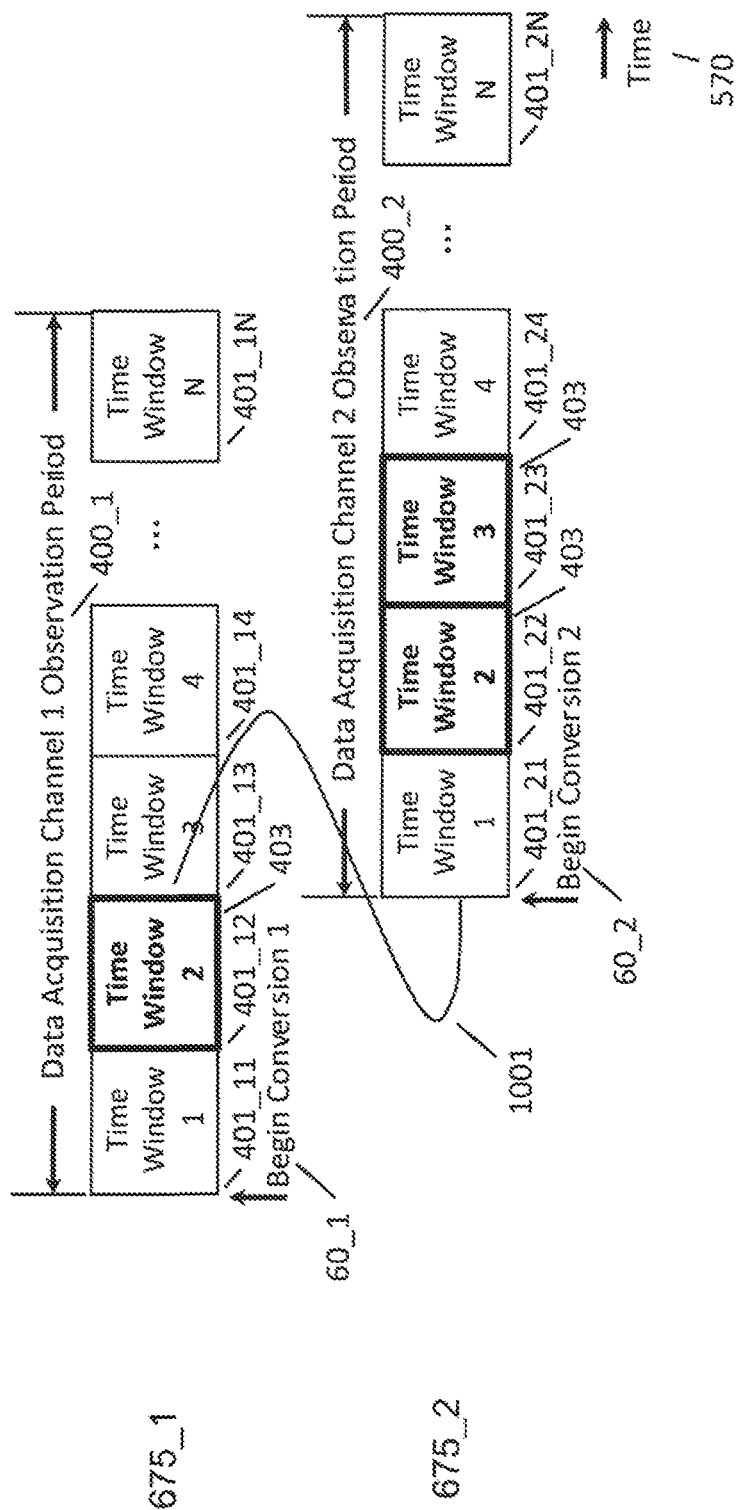

With reference to FIG. 27, an application in which a dependent condition may cause a Begin Conversion 60 signal to become active is shown. In this example, when the Data of Interest is identified in Time Window 2 401_12 of Channel 1 675_1, Begin Conversion 2 60_2 may become active at the start of the following Time Window 3 401_13 as indicated by sequence of event arrow 1001. Thus, Time Window 1 401_21 of Channel 2 675_2 starts at the same time as Time Window 3 401_13 and is followed by subsequent time windows 401_22, 401_23, 401_24, . . . 401_2N. The Data of Interest can be identified in Time Window 2 401_22 and Time Window 3 401_23 of Channel 2 675_2 which can result in start times of Time Windows in other channels.

Figure 28:
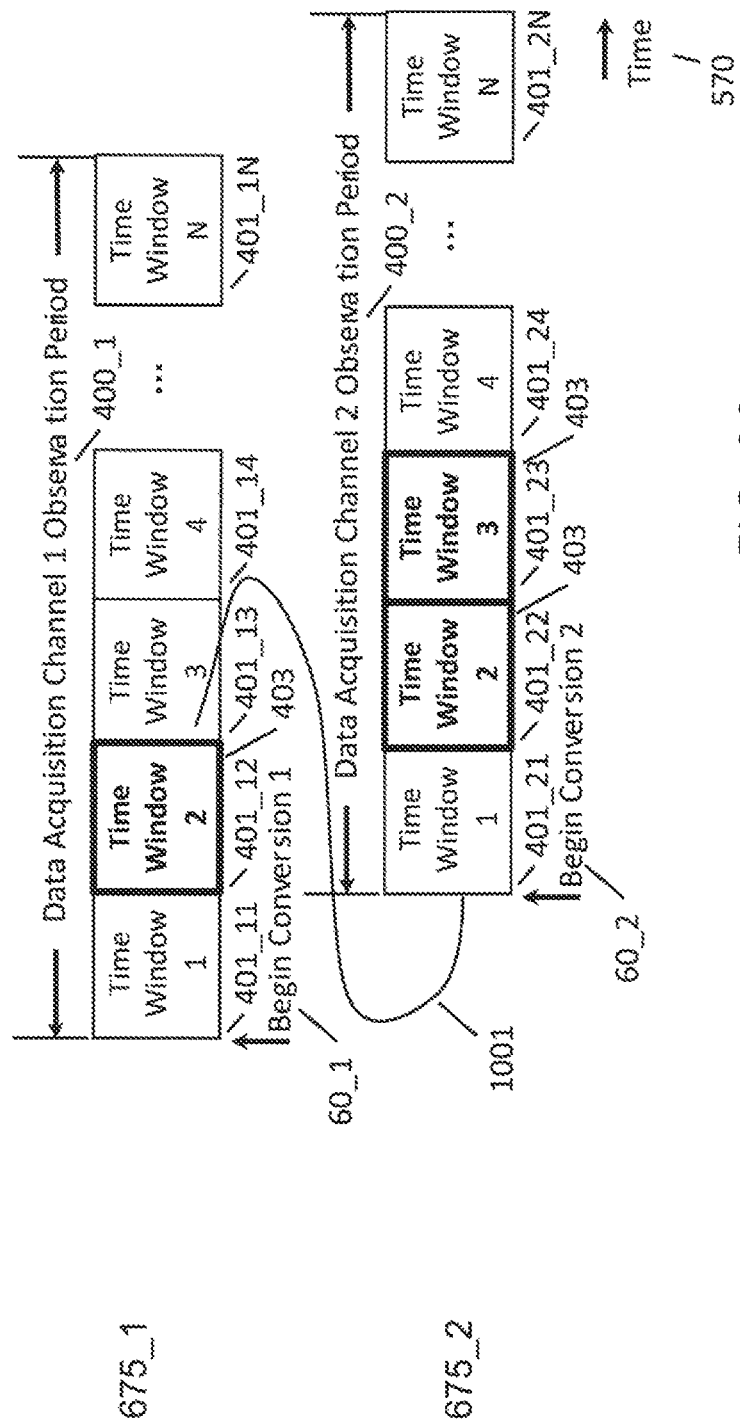

With reference to FIG. 28, instead of Begin Conversion 2 60_2 becoming active at the start of the following Time Window 401, Begin Conversion 2 60_2 may become active at the start of every Time Window 401. If Data of Interest is identified in the current Time Window 401 of Channel 1 675_1, data continues to be acquired by Complete Data Acquisition Channel 2 675_2. If Data of Interest is not identified in the current Time Window 401, data acquired in Time Window 1 401_21 is discarded and the Begin Conversion 2 60_2 may become active at the start of the next Time Window which will be Time Window 2 401_12.

While each of the channels are able to operate with a high degree of independence, they may be operated in a coordinated manner. These examples illustrate how the different channels may be coordinated. Other configurations and timing options may be utilized for different applications. The configurations may be easily changed to be optimized for changing system requirements.

Figure 29:
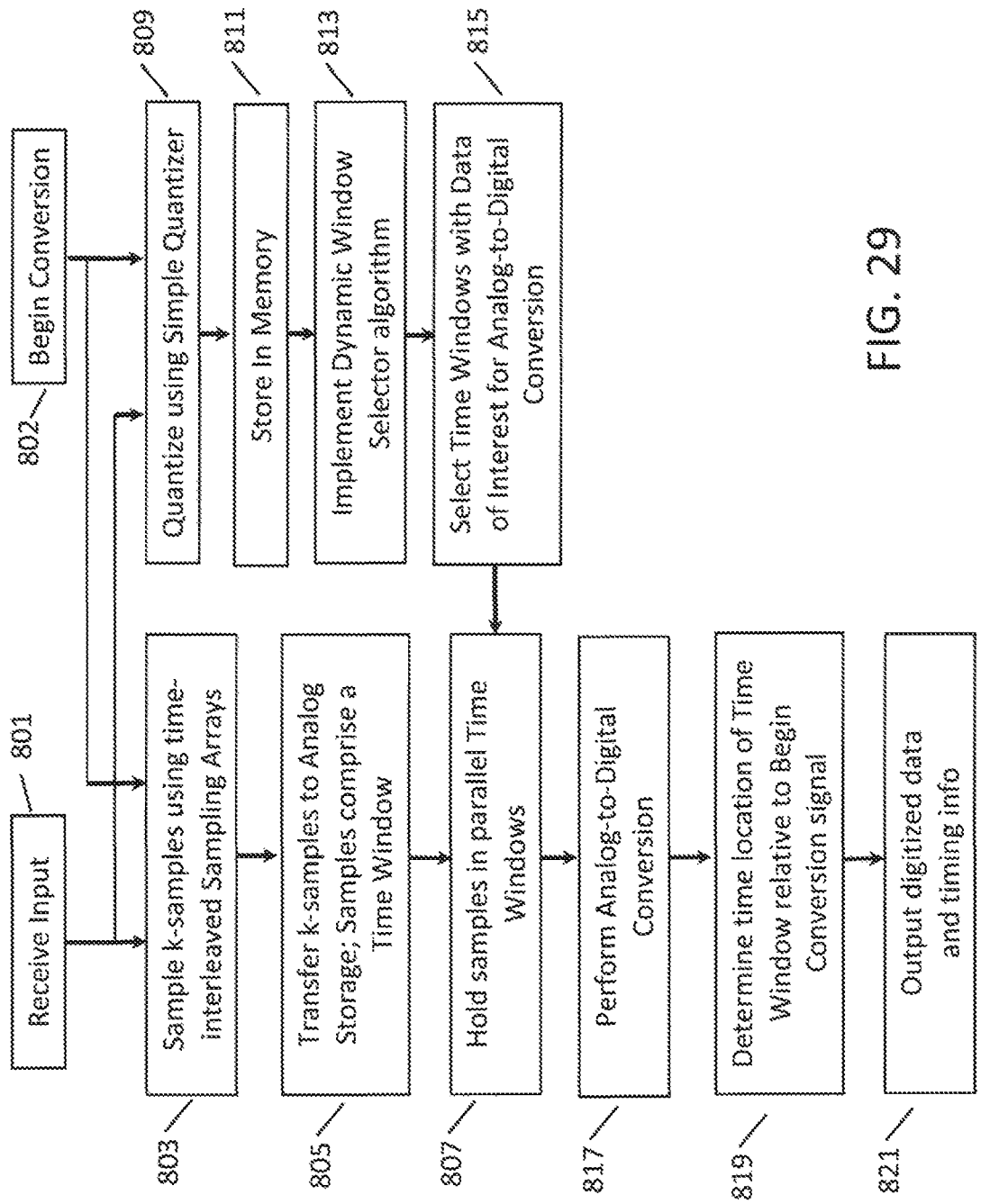
FIG. 29. Illustrates a flow diagram of a data acquisition channel.

With reference to FIG. 29, a flow graph of the key steps in the implementation of a data acquisition channel employing activity detection is shown. Begin with receiving input signal from a sensor 803 and receiving the Begin Conversion signal 802. In the first path, the data acquisition system takes k-samples using one of the time-interleaved Sampling Arrays 804. The k-samples are then transferred to Analog Storage 805. The Analog Storage holds groups of samples in parallel Time Windows (also called Analog Storage) 807. In the second path, the activity detector can quantize the input using the Simple Quantizer 809. The Simple Quantizer output can be stored in Memory 811. This data can be retrieved from Memory and processed by the Dynamic Window Selector algorithm 813 to identify Time Windows with Data of Interest. The Time Windows with Data of Interest can be identified for Analog-to-Digital conversion 815. The data acquisition system can perform Analog-to-Digital Conversion on the Time Windows with Data of Interest 817. The data acquisition system can determine time location of Time Window relative to the Begin Conversion signal 819. The data acquisition system can output received signals in digital format and time relative to the Begin Conversion signal 821.

Figure 30:
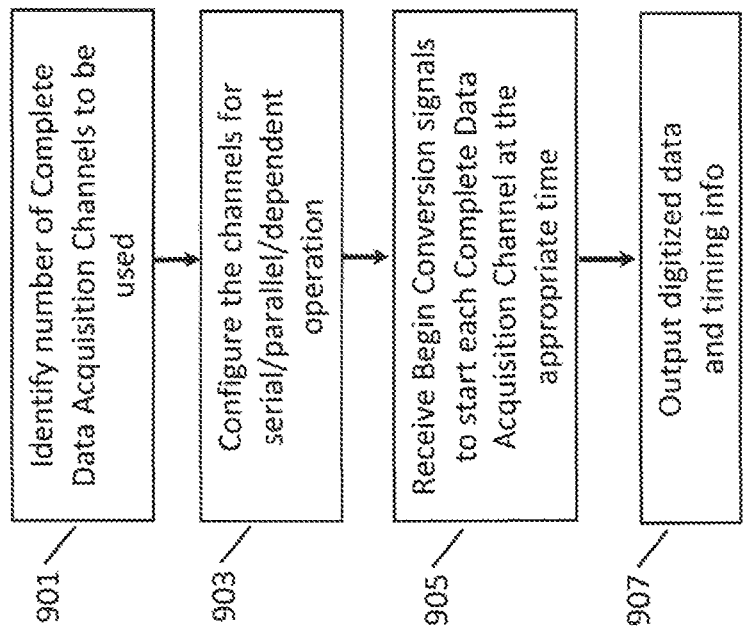
FIG. 30. Illustrates a flow diagram for multiple coordinated data acquisition channels.

With reference to FIG. 30, a flow graph of the steps in utilizing a multiplicity of Complete Data Acquisition Channels is shown. Begin with identifying the desired number of Complete Data Acquisition Channels to be used 901. Configure the channels for the desired operation which can be serial, parallel, dependent, or other operations 903. This may include connecting the inputs of each channel to the appropriate sensor, sensors, input buffer, or input buffers and the appropriate Begin Conversion signals provided by the system. Receive the Begin Conversion signals to start operation 905. Process the data by the Complete Data Acquisition Channels. Output digitized data and timing information 907.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention and some of its advantages have been described in detail for some embodiments. It should be understood that although the process is described with reference to a device, system, and method the process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A data acquisition system, comprising:
   an input for receiving input signals from a sensor;
   a first time-interleaved sampling array coupled to the input;
   a first multiplexor coupled to the first time-interleaved sampling array;
   a first analog storage array coupled to the first multiplexor;
   a first selector coupled to the first analog storage array;
   a first analog-to-digital converter coupled to the first selector;
   a second time-interleaved sampling array coupled to the input;
   a second multiplexor coupled to the second time-interleaved sampling array;
   a second analog storage array coupled to the second multiplexor;
   a second selector coupled to the second analog storage array;
   a second analog-to-digital converter coupled to the second selector; and
   an activity detector having a quantizer, a memory, and a dynamic window selector wherein the activity detector is coupled to the input for alternating between sampling the input during a first time-interleaved sampling array sampling period and a second time-interleaved sampling array sampling period.

2. The data acquisition system of claim 1 wherein the dynamic window selector provides a signal indicating an identification of data of interest within first samples of the first time-interleaved sampling array, and transfers samples from the first time-interleaved sampling array to the first analog storage array where the sample are stored, and the first selector connects the samples stored in the first analog storage array to the first analog-to-digital converter which converts the samples to first digital representations.

3. The data acquisition system of claim 2 wherein the dynamic window selector provides a signal indicating an identification of data of interest within second samples of the second time-interleaved sampling array and transfers the second samples from the second time-interleaved sampling array to the second analog storage array, the second selector connects the second samples stored in the second analog storage array to the second analog-to-digital converter, and the second analog-to-digital converter converts the second samples to second digital representations.

4. The data acquisition system of claim 3 further comprising:
   a time tracker that receives a begin conversion signal and begins counting sampling array periods when a begin conversion signal becomes active.

5. The data acquisition system of claim 4 wherein when the time tracker receives an identification of data of interest from the activity detector, the time tracker connects the first time-interleaved sampling array with identified data of interest to the first analog storage array through the first multiplexor and identifies the sampling period count associated with the first time-interleaved sampling array.

6. The data acquisition system of claim 1 wherein the first time-interleaved sampling array samples the input signal at rate between 100 MHz and 12 GHz, and the second-time interleaved sampling array samples the input signal at rate between 100 MHz and 12 GHz.

7. The data acquisition system of claim 1 wherein the first analog-to-digital converter has a resolution between 8 bits and 12 bits.

8. The data acquisition system of claim 1 further comprising:
   a digital signal processor coupled to the first analog-to-digital converter and the second analog-to-digital converter wherein the digital signal processor performs at least one of the following: gain control, filtering, digital calibration, and digital correction.

9. The data acquisition system of claim 1 further comprising:
   a particle accelerator;
   wherein the sensor detects collision artifacts resulting from particle collisions.

10. The data acquisition system of claim 1 wherein the activity detector includes a first activity detector coupled to the first multiplexer and a second detector coupled to the second multiplexer.

11. A data acquisition system, comprising:
    an input for receiving input signals from a sensor;
    a first time-interleaved sampling array coupled to the input;
    a second time-interleaved sampling array coupled to the input;
    a switch coupled to the first time-interleaved sampling array and the second time-interleaved sampling array;
    a multiplexor coupled to the switch;
    a first analog storage array coupled to the multiplexor;
    a second analog storage array coupled to the multiplexor;

a selector coupled to the first analog storage array and the second analog storage array;

an analog-to-digital converter coupled to the selector; and a digital processor coupled to the analog-to-digital converter wherein the digital signal processor performs at least one of the following: gain control, filtering, digital calibration, and digital correction.

12. The data acquisition system of claim 11, further comprising:

a time tracker coupled to the multiplexor wherein the time tracker that receives a begin conversion signal and the time tracker begins counting sampling array periods which are received by the multiplexer when the begin conversion signal becomes active.

13. The data acquisition system of claim 11, further comprising:

a time tracker that receives a begin conversion signal wherein the time tracker begins counting sampling array periods when the begin conversion signal becomes active; and an activity detector coupled to the time tracker wherein the activity detector activates the begin conversion signal when the activity detector identifies portions of data containing data of interest in the input signals.

14. The data acquisition system of claim 11, further comprising:

an activity detector coupled to the input for alternating between sampling the input during a first time-interleaved sampling array sampling period and a second time-interleaved sampling array sampling period.

15. The data acquisition system of claim 11, wherein the first analog storage array and the second analog storage array are parts of a plurality of analog storage arrays which each store a data samples from a time window.

16. The data acquisition system of claim 11 further comprising:

a digital signal processor coupled to the first analog-to-digital converter and the second analog-to-digital converter wherein the digital signal processor performs at least one of the following: gain control, filtering, digital calibration, and digital correction.

17. The data acquisition system of claim 11 further comprising:

a particle accelerator;

wherein the sensor detects collision artifacts resulting from particle collisions.

18. The data acquisition system of claim 11 further comprising:

a particle accelerator;

wherein the sensor detects is a light sensor that detects collision artifacts resulting from particle collisions.

19. A data acquisition system, comprising:

an input for receiving input signals from a sensor;

a first time-interleaved sampling array coupled to the input;

a first multiplexor coupled to the first time-interleaved sampling array;

a second time-interleaved sampling array coupled to the input;

a second multiplexor coupled to the second time-interleaved sampling array;

a plurality of analog storage arrays coupled to the first multiplexor and the second multiplexer;

a selector coupled to the plurality of analog storage arrays;

an analog-to-digital converter coupled to the selector; and a digital processor coupled to the analog-to-digital converter wherein the digital signal processor performs at least one of the following: gain control, filtering, digital calibration, and digital correction.

20. The data acquisition system of claim 19, further comprising:

a time tracker coupled to the first multiplexor and the second multiplexer wherein the time tracker that receives a begin conversion signal and the time tracker begins counting sampling array periods which are received by the first multiplexor and the second multiplexer when the begin conversion signal becomes active.

* * * * *

UNITED STATES PATENT AND TRADEMARK OFFICE
CERTIFICATE OF CORRECTION

| | | |
|---|---|---|
| PATENT NO. | : 10,715,166 B2 | Page 1 of 1 |
| APPLICATION NO. | : 16/568126 | |
| DATED | : July 14, 2020 | |
| INVENTOR(S) | : Mostafanezhad et al. | |

It is certified that error appears in the above-identified patent and that said Letters Patent is hereby corrected as shown below:

In the Specification

On Column 1, Line 24 please add the following text:
"GOVERNMENT LICENSE RIGHTS
This invention was made with government support under DE-SC0017833 and DE-SC0015231 awarded by US Department of Energy. The government has certain rights in the invention."

Signed and Sealed this
Eighth Day of September, 2020

Andrei Iancu
*Director of the United States Patent and Trademark Office*